US012787435B2

(12) United States Patent
Choi et al.

(10) Patent No.: US 12,787,435 B2
(45) Date of Patent: Nov. 3, 2026

(54) DISPLAY DEVICE AND TILED DISPLAY DEVICE

(71) Applicant: Samsung Display Co., LTD., Yongin-si (KR)

(72) Inventors: Nak Cho Choi, Yongin-si (KR); Yong Duck Son, Yongin-si (KR); Sang Woo An, Yongin-si (KR); Kye Uk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 847 days.

(21) Appl. No.: 18/158,958

(22) Filed: Jan. 24, 2023

(65) Prior Publication Data

US 2023/0238399 A1 Jul. 27, 2023

(30) Foreign Application Priority Data

Jan. 26, 2022 (KR) ........................ 10-2022-0011637
Aug. 26, 2022 (KR) ........................ 10-2022-0107614

(51) Int. Cl.
*H10D 86/60* (2025.01)
*G01R 31/28* (2006.01)
(Continued)

(52) U.S. Cl.
CPC ......... *H10D 86/60* (2025.01); *G01R 31/2884* (2013.01); *H10D 86/443* (2025.01);
(Continued)

(58) Field of Classification Search
CPC .... H10D 86/60; H10D 86/443; H10D 86/411; G01R 31/2884; H10W 90/00; H10W 72/242
See application file for complete search history.

(56) References Cited

U.S. PATENT DOCUMENTS 9,341,563 B2 5/2016 Amari
9,575,386 B2 * 2/2017 Choi .................... H10D 86/441
(Continued)

FOREIGN PATENT DOCUMENTS

JP 2021-043458 A 3/2021
JP 6856472 B2 4/2021
(Continued)

OTHER PUBLICATIONS

Office Action dated Jan. 13, 2026 regarding Korean Patent Application No. 10-2022-0107614 corresponding to U.S. Appl. No. 18/158,958 (6 pages).

*Primary Examiner* — Marvin Payen
(74) *Attorney, Agent, or Firm* — Womble Bond Dickinson (US) LLP

(57) ABSTRACT

A display device including a substrate having a first side surface, a first surface, a second surface opposite to the first surface, a first chamfered surface extending from an edge of the first surface to the first side surface, a second chamfered surface extending from an edge of the second surface t the first side surface, a pixel on the first surface of the substrate and including a light emitting element configured to emit light, a first driving pad at the edge of the first surface of the substrate and electrically connected to the pixel, and a side wiring on the first surface, the first chamfered surface, the first side surface, the second chamfered surface, and the second surface of the substrate. The first driving pad has a flat portion connected to the side wiring.

23 Claims, 31 Drawing Sheets

(51) Int. Cl.

| | |
|---|---|
| ***H10D 86/40*** | (2025.01) |
| ***H10W 72/20*** | (2026.01) |
| ***H10W 72/90*** | (2026.01) |
| ***H10W 90/00*** | (2026.01) |

(52) U.S. Cl.

CPC .......... *H10W 90/00* (2026.01); *H10D 86/411* (2025.01); *H10W 72/242* (2026.01); *H10W 72/90* (2026.01); *H10W 72/923* (2026.01); *H10W 72/9415* (2026.01); *H10W 72/942* (2026.01); *H10W 72/944* (2026.01); *H10W 72/953* (2026.01); *H10W 90/724* (2026.01); *H10W 90/792* (2026.01)

(56) References Cited

U.S. PATENT DOCUMENTS

| | | | |
|---|---|---|---|
| 11,877,483 | B2 | 1/2024 | Lee et al. |
| 2023/0207318 | A1 | 6/2023 | Choi et al. |
| 2023/0237937 | A1 | 7/2023 | Choi et al. |

FOREIGN PATENT DOCUMENTS

| | | | | |
|---|---|---|---|---|
| KR | 2019-0044016 | A | 4/2019 | |
| KR | 2021-0020677 | A | 2/2021 | |
| KR | 2021-0061957 | A | 5/2021 | |
| KR | 2021-0068356 | A | 6/2021 | |
| KR | 2021-0142805 | A | 11/2021 | |
| KR | 102369300 | B1 * | 3/2022 | ........... H10K 71/166 |
| KR | 2023-0097279 | A | 7/2023 | |
| KR | 2023-0116154 | A | 8/2023 | |
| KR | 102874594 | B1 * | 10/2025 | ............. H10K 50/80 |
| TW | 201532304 | A | 8/2015 | |
| WO | WO 2023-146054 | A1 | 8/2023 | |

* cited by examiner

GTL2 : BL
DTL1 : SPD1
DTL2 : SPD2
DTL3 : SPD3
DTL4 : SPD4
PD1a : SPD4
PD1b : SPD1, SPD2, SPD3, SPD4

Confocal microscope

DISPLAY DEVICE AND TILED DISPLAY DEVICE

CROSS-REFERENCE TO RELATED APPLICATION

This application claims priority to and the benefit of Korean Patent Application No. 10-2022-0011637 filed on Jan. 26, 2022, and Korean Patent Application No. 10-2022-0107614 filed on Aug. 26, 2022, in the Korean Intellectual Property Office (KIPO), the entire contents of all of which are incorporated by reference herein.

BACKGROUND

1. Field

Aspects of one or more embodiments of the present disclosure relate to a display device and a tiled display device.

2. Description of the Related Art

With the advance of information-oriented society, more and more demands are placed on display devices for displaying images in various ways. The display device may be a flat panel display device such as a liquid crystal display, a field emission display, and a light emitting display. The light emitting display device may include an organic light emitting diode (OLED) display including an organic light emitting diode as a light emitting element or a light emitting diode display including an inorganic light emitting diode such as a light emitting diode (LED) as a light emitting element.

The display device includes a display area including units of pixels displaying an image and a non-display area (or a bezel area) in which lines for driving pixels are disposed. Recently, bezel-less display devices have been released to increase or maximize the area of the display area. Accordingly, there is an increasing demand for a display device in which the area of the non-display area is reduced or the non-display area is omitted by forming the line on the side surface of the substrate.

SUMMARY

Aspects and features of embodiments of the present disclosure provide a display device capable of improving image quality defects or electrical short circuits by changing a pad design.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate having a first side surface, a first surface, a second surface opposite to the first surface, a first chamfered surface extending from an edge of the first surface to the first side surface, a second chamfered surface extending from an edge of the second surface to the first side surface, the first side surface connecting the first surface, the first chamfered surface, the second chamfered surface, and the second surface, a pixel on the first surface of the substrate and including a light emitting element configured to emit light, a first driving pad at the edge of the first surface of the substrate and electrically connected to the pixel, and a side wiring on the first surface, the first chamfered surface, the first side surface, the second chamfered surface, and the second surface of the substrate. The first driving pad has a flat portion connected to the side wiring, and a partition wall portion having a thickness greater than a thickness of the flat portion of the first driving pad.

A top surface of the flat portion of the first driving pad may be lower than a top surface of the partition wall portion of the first driving pad.

The display device may further include a bottom wiring configured to supply a power voltage or a signal to the pixel on the first surface of the substrate. The first driving pad includes a plurality of sub pads, at least one of the sub pads from among the sub pads of the first driving pad may have a first contact portion connected to the bottom wiring in the partition wall portion of the first driving pad.

The side wiring may overlap the flat portion of the first driving pad in a thickness direction of the substrate and may not overlap the partition wall portion of the first driving pad in the thickness direction of the substrate.

The partition wall portion of the first driving pad may have a first portion extending in a first direction, a second portion extending in a second direction crossing the first direction and extending from an end of the first portion, and a third portion extending in the second direction and extending from an other end of the first portion. The first portion, the second portion, and the third portion may be around three side surfaces of the flat portion of the first driving pad.

A first portion of the partition wall portion of the first driving pad may be between the pixel and the flat portion of the first driving pad.

The display device may further include pad electrodes on the first surface of the substrate and connected to the light emitting element. The flat portion of the first driving pad may be at a same layer and may include a same material as that of the pad electrodes.

According to one or more embodiments of the present disclosure, there is provided a display device including a substrate having a first side surface, a first surface, a second surface opposite to the first surface, a first chamfered surface extending from an edge of the first surface, a second chamfered surface extending from an edge of the second surface, the first side surface connecting the first surface, the first chamfered the surface, the second chamfered surface, and the second surface, a thin film transistor layer including a plurality of thin film transistors on the first surface of the substrate, a plurality of data metal layers, and a plurality of planarization layers on the plurality of thin film transistors, a first driving pad spaced from the planarization layers on the first surface of the substrate, and a side wiring on the first surface, the first chamfered surface, the first side surface, the second chamfered surface, and the second surface of the substrate. The first driving pad has a flat portion in contact with the side wiring and having one surface parallel to the first surface of the substrate, and a partition wall portion at where the plurality of data metal layers are stacked.

The plurality of data metal layers may further include a lower data metal layer including a first sub pad and a first connection electrode connected to a thin film transistor from among the plurality of thin film transistors, an upper data metal layer on the lower data metal layer and including a second sub pad and an anode pad electrode connected to the first connection electrode, a first protective layer exposing a part of upper surfaces of the second sub pad and the anode pad electrode. The second sub pad may overlap the first sub pad in the partition wall portion of the first driving pad and may not overlap the first sub pad in the flat portion of the first driving pad.

The second sub pad may be in contact with a part of an upper surface and a side surface of the first sub pad.

The partition wall portion of the first driving pad may be between the flat portion of the first driving pad and the plurality of planarization layers.

A top surface of the partition wall portion of the first driving pad may be higher than a top surface of the flat portion of the first driving pad.

The display device may further include a bottom wiring between the first surface of the substrate and the first driving pad. The partition wall portion of the first driving pad may have a first contact portion exposing a top surface of the bottom wiring.

According to one or more embodiments of the present disclosure, there is provided a display device including a substrate having a first side surface, a first surface, a second surface opposite to the first surface, a first chamfered surface extending from an edge of the first surface to the first side surface, a second chamfered surface extending from an edge of the second surface to the first side surface, the first side surface connecting the first surface, the first chamfered the surface, the second chamfered surface, and the second surface, a pixel on the first surface of the substrate and including a light emitting element configured to emit light, a first driving pad at the edge of the first surface of the substrate and electrically connected to the pixel, an inspection pad connected to the first driving pad on the first surface of the substrate, and a side wiring connected to the first driving pad and being on the first surface of the substrate, the first chamfered surface, the first side surface, the second chamfered surface, and the second surface. The inspection pad may have a flat portion and a partition wall portion having an upper surface higher than an upper surface of the flat portion.

The display device may further include a first connection line connecting the first driving pad and the inspection pad. The first connection line may be at a same layer as a gate electrode of a thin film transistor.

The inspection pad may have an L-shape in a cross-sectional view. The flat portion of the inspection pad may form a bottom surface of the inspection pad, and the partition wall portion of the inspection pad may form a partition wall of the inspection pad.

A top surface of the partition wall portion of the inspection pad may be 1 μm to 3 μm higher than a top surface of the flat portion of the inspection pad.

The display device may further include a plurality of thin film transistors on the first surface of the substrate, a lower data metal layer on the thin film transistors, an upper data metal layer on the lower data metal layer, and a first passivation layer exposing a part of an upper surface of the upper data metal layer. The upper data metal layer may overlap the lower data metal layer at the partition wall portion of the inspection pad and may not overlap the lower data metal layer at the flat portion of the inspection pad.

According to one or more embodiments of the present disclosure, there is provided a tiled display device including a plurality of display devices and a connection member between the display devices. A first display device from among the display devices includes a substrate having a first side surface, a first surface, a second surface opposite to the first surface, a first chamfered surface extending from an edge of the first surface to the first side surface, and a second chamfered surface extending from an edge of the second surface to the first side surface, the first side surface connecting the first surface, the first chamfered the surface, the second chamfered surface, and the second surface, a pixel on the first surface of the substrate and including a light emitting element configured to emit light, a first driving pad at the edge of the first surface of the substrate and electrically connected to the pixel, an inspection pad connected to the first driving pad on the first surface of the substrate, and a side wiring connected to the first driving pad and being on the first surface of the substrate, the first chamfered surface, the first side surface, the second chamfered surface, and the second surface. The inspection pad has a flat portion and a partition wall portion having an upper surface higher than an upper surface of the flat portion.

The light emitting element may be a flip-chip type micro light emitting diode element.

The substrate may include glass.

The first display device may further include a connection line on the second surface of the substrate, and a flexible film connected to the connection line through a conductive adhesive member. The side wiring may be connected to the connection line.

The display devices may be arranged in a matrix form in M rows and N columns, and wherein M and N are positive integers.

According to the aforementioned and other embodiments of the present disclosure, the driving pad contacting the side wiring may include two areas having different upper surfaces. Accordingly, it is possible to stably contact the driving pad and the side wiring.

According to the aforementioned and other embodiments of the present disclosure, an inspection pad for testing a contact defect between the driving pad and the side wiring may be included. because the inspection pad includes two areas having different upper surfaces, it is possible to improve the occurrence of an electrical short by the inspection probe.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
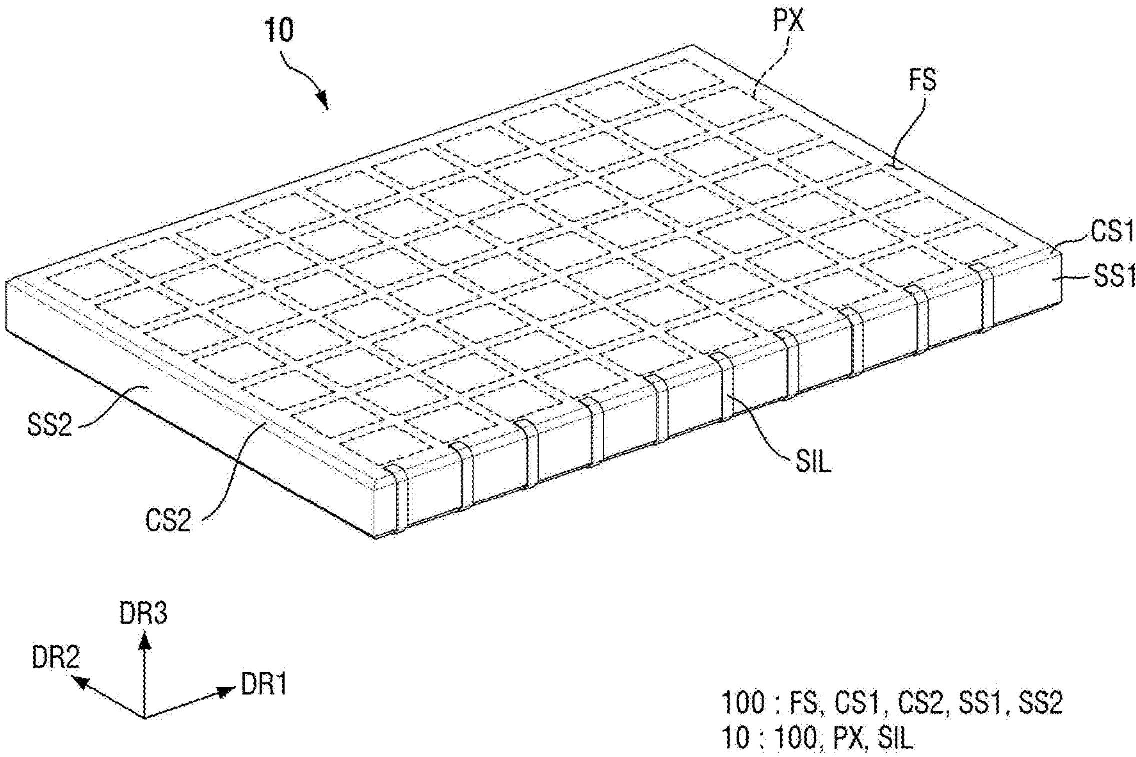
FIG. 1 is a perspective view illustrating a front surface of a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in a plan view," may refer to viewing a target portion from the top, and the phrase "on a cross-section" may refer to viewing a cross-section formed by vertically cutting a target portion from the side.

It will be understood that when an element, layer, region, or component is referred to as being “formed on,” “on,” “connected to,” or “coupled to” another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being “electrically connected” or “electrically coupled” to another layer, region, or component, it can be directly electrically connected or coupled to the other layer, region, and/or component or intervening layers, regions, or components may be present. However, “directly connected/directly coupled” refers to one component directly connecting or coupling another component without an intermediate component. Meanwhile, other expressions describing relationships between components such as “between,” “immediately between” or “adjacent to” and “directly adjacent to” may be construed similarly. In addition, it will also be understood that when an element or layer is referred to as being “between” two elements or layers, it can be the only element or layer between the two elements or layers, or one or more intervening elements or layers may also be present.

For the purposes of this disclosure, expressions such as “at least one of,” “one of,” and “selected from,” when preceding a list of elements, modify the entire list of elements and do not modify the individual elements of the list. For example, “at least one of X, Y, and Z,” “at least one of X, Y, or Z,” and “at least one selected from the group consisting of X, Y, and Z” may be construed as X only, Y only, Z only, any combination of two or more of X, Y, and Z, such as, for instance, XYZ, XYY, YZ, and ZZ, or any variation thereof. Similarly, the expression such as “at least one of A and B” may include A, B, or A and B. As used herein, the term “and/or” includes any and all combinations of one or more of the associated listed items. For example, the expression such as “A and/or B” may include A, B, or A and B. Further, the use of “may” when describing embodiments of the present disclosure refers to “one or more embodiments of the present disclosure”.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments of the present disclosure and is not intended to be limiting of the present disclosure. As used herein, the singular forms “a” and “an” are intended to include the plural forms as well, unless the context clearly indicates otherwise. It will be further understood that the terms “comprises,” “comprising,” “have,” “having,” “includes,” and “including,” when used in this specification, specify the presence of the stated features, integers, steps, operations, elements, and/or components, but do not preclude the presence or addition of one or more other features, integers, steps, operations, elements, components, and/or groups thereof.

As used herein, the term “substantially,” “about,” “approximately,” and similar terms are used as terms of approximation and not as terms of degree, and are intended to account for the inherent deviations in measured or calculated values that would be recognized by those of ordinary skill in the art. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value. Further, the use of “may” when describing embodiments of the present disclosure refers to “one or more embodiments of the present disclosure.”

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning for example consistent with their meaning in the context of the relevant art and/or the present specification, and should not be interpreted in an idealized or overly formal sense, unless expressly so defined herein.

Figure 2:
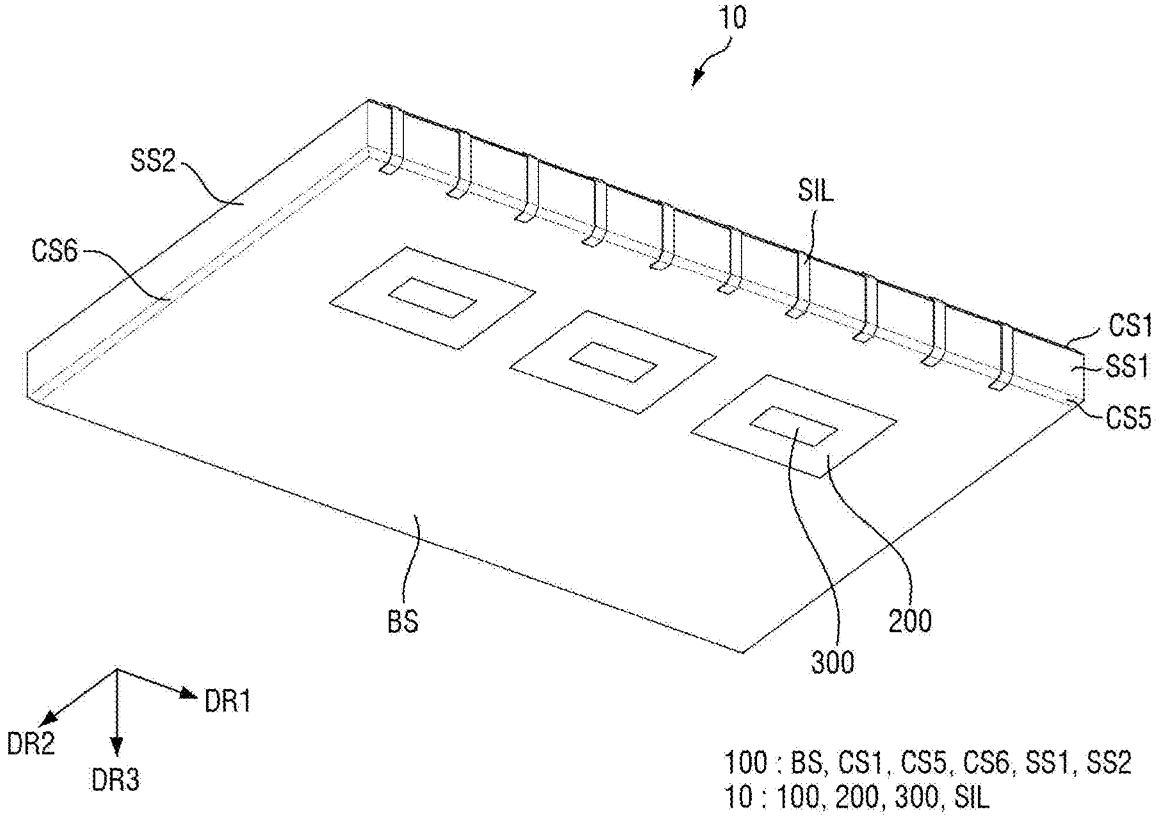
FIG. 2 is a perspective view illustrating a bottom surface of a display device according to one or more embodiments.

FIG. 1 is a perspective view illustrating a front surface of a display device according to one or more embodiments. FIG. 2 is a perspective view illustrating a bottom surface of a display device according to one or more embodiments.

In FIGS. 1 and 2, a first direction DR1, a second direction DR2, and a third direction DR3 are indicated. The first direction DR1 indicates a horizontal direction of the display device 10, the second direction DR2 indicates a vertical direction of the display device 10, and the third direction DR3 indicates a thickness of the display device 10. In this case, "left", "right", "top", and "bottom" indicate directions when the display device 10 is viewed from a plane. For example, "right" refers to one side of the first direction DR1, "left" refers to the other side of the first direction DR1, "upper side" refers to one side of the second direction DR2, and "bottom side" refers to the other side of the second direction DR2. Also, "upper" refers to one side of the third direction DR3 and "bottom" refers to the other side of the third direction DR3. "Upper" may be referred to as one surface, front, or the first surface of the display device 10 and "bottom" may be referred to as the other, rear, or the second surface of the display device 10.

Referring to FIGS. 1 to 2, a display device 10 according to one or more embodiments is a device for displaying a moving image or a still image. The display device may be used as a display screen of various products such as televisions, laptop computers, monitors, billboards, and the Internet of Things (IOT) as well as portable electronic devices such as mobile phones, smart phones, tablet personal computer (tablet PC), smart watches, watch phones, mobile communication terminals, electronic notebooks, electronic books, portable multimedia players (PMPs), navigation systems, and ultra mobile PCs (UMPCs).

The display device 10 may have a flat shape similar to a quadrangle. For example, the display device 10 may have a planar shape similar to the quadrangle having a long side in the first direction DR1 and a short side in the second direction DR2 as shown in FIG. 1. An edge where the long side of the first direction DR1 and the short side of the second direction DR2 meet may be rounded to have a suitable curvature (e.g., a predetermined curvature) or may be formed at a right angle. The flat shape of the display device 10 is not limited to the quadrangle, and may be formed similarly to other polygons, circles, or ovals.

The display device 10 according to one or more embodiments may include a substrate 100, a plurality of pixels PX, a plurality of side wirings SIL, a circuit board 200, and a display driving circuit 300.

The substrate 100 may serve as a base of the display device 10. The substrate 100 has a three-dimensional shape similar to a rectangular parallelepiped, and may include a front surface, a side surface, and a bottom surface. The substrate 100 may have a shape in which corners formed by the front surface and side surfaces and corners formed by the bottom surface and side surfaces are bent. For example, the substrate 100 may include chamfered surfaces formed by bending corners.

The substrate 100 may include a first surface FS, a second surface BS, a plurality of side surfaces, and a plurality of chamfered surfaces.

The first surface FS may be the front surface of the substrate 100. The first surface FS may have a rectangular shape having a long side in the first direction DR1 and a short side in the second direction DR2.

The second surface BS may be a surface opposite to the first surface FS in the third direction DR3. The second surface BS may be a bottom surface of the substrate 100. The second surface BS may have a rectangular shape having a long side in the first direction DR1 and a short side in the second direction DR2.

The plurality of side surfaces is disposed between the first surface FS and the second surface BS and may be a side surface of the substrate 100. The first side surface SS1 may be a side extending from a lower side (e.g., an edge) of the first side FS (the other side in the second direction DR2) among the plurality of side surfaces. The second side surface SS2 may be a side extending from the left side of the first side FS (the other side in the first direction DR1) among the plurality of side surfaces. In one or more embodiments, a side extending from an upper side (one side of the second direction DR2) of the first side FS among the plurality of side surfaces may be referred to as a "third side", and a side extending from the right side of the first side FS (one side in the first direction DR1) may be referred to as a "fourth side".

The plurality of chamfered faces refers to faces that are slanted disposed between the first surface FS and the plurality of side surfaces, and between the second surface BS and the plurality of side surfaces to prevent chipping defects from occurring in the plurality of side wirings SIL. It is possible to prevent chipping or cracks from occurring in the plurality of side wirings SIL due to the plurality of chamfered surfaces.

A first chamfered surface CS1 may be disposed between the first surface FS and the first side surface SS1. A second chamfered surface CS2 may be disposed between the first surface FS and the second side surface SS2. A third chamfered surface may be disposed between the first surface FS and the third side surface. A fourth chamfered surface may be disposed between the first surface FS and the fourth side surface. An interior angle between the first surface FS and the first chamfered surface CS1, an interior angle between the first surface FS and the second chamfered surface CS2, an interior angle between the first surface FS and the third chamfered surface, and an interior angle between the first surface FS and the fourth chamfered surface may be greater than 90 degrees, respectively.

A fifth chamfered surface CS5 may be disposed between the second surface BS and the first side surface SS1. A sixth chamfered surface CS6 may be disposed between the second surface BS and the second side surface SS2. A seventh chamfered surface may be disposed between the second surface BS and the third side surface. The eighth chamfered surface may be disposed between the second surface BS and the fourth side surface. An interior angle between the second surface BS and the fifth chamfered surface CS5, an interior angle between the second surface BS and the sixth chamfered surface CS6, an interior angle between the second surface BS and the seventh chamfered surface, and an interior angle between the second surface BS and the eighth chamfered surface may be greater than 90 degrees, respectively.

The plurality of pixels PX may be disposed on the first surface FS of the substrate 100 to display an image. The plurality of pixels PX may be arranged in a matrix form along the first direction DR1 and the second direction DR2. A detailed description of the plurality of pixels PX will be described later with reference to FIGS. 3 and 4

Each of the plurality of side wirings SIL serves to connect a first driving pad (PD1 in FIG. 7) disposed on the first surface FS, for example, a front driving pad and a second driving pad (PD2 in FIG. 8) disposed on the second surface BS, for example, a rear driving pad. A first driving pads PD1 may be connected to data lines connected to the pixels PX of the substrate 100.

The plurality of side wirings SIL may be disposed on the first surface FS, the second surface BS, at least any two chamfered surfaces from among the plurality of chamfered surfaces, and at least one side of the plurality of sides. For example, the plurality of side wirings SIL may be disposed on the first surface FS, the second surface BS, the first chamfered surface CS1, the fifth chamfered surface CS5, and the first side SS1 to connect the first driving pads PD1 disposed on the first side of the first surface FS (the other side of the second direction DR2 in FIG. 1) and the second driving pads PD2 disposed on the first side (one side of the second direction DR2 in FIG. 2) of the second surface BS.

In one or more embodiments, when the first driving pads PD1 disposed on the second side of the first surface FS (the other side of the first direction DR1 in FIG. 1) and the second driving pads PD2 are disposed on the second side of the second surface BS (one side of the first direction DR1 in FIG. 2) are additionally included, the plurality of side wirings SIL may be additionally disposed on the first surface FS, the second surface BS, the second chamfered surface CS2, the sixth chamfered surface CS6, and the second side surface SS2.

The circuit boards 200 may be disposed on the second surface BS of the substrate 100. Each of the circuit boards 200 may be connected to a third driving pad (PD3 in FIG. 8) disposed on the second surface BS of the substrate 100 using a conductive adhesive member such as an anisotropic conductive film ACF. As will be described later with reference to FIG. 8, since the third driving pads PD3 are electrically connected to the second driving pads PD2, respectively, the circuit board 200 may be electrically connected to the first driving pads PD1 through the side wirings SIL. The circuit boards 200 may be a flexible film such as a flexible printed circuit board, a printed circuit board, or a chip on film.

The display driving circuit 300 generates data voltages and supplies them to the data lines through the circuit board 200, the third driving pads PD3, the second driving pads PD2, the plurality of side wirings SIL, and the first driving pads PD1. The display driving circuit 300 may be formed as an integrated circuit (IC) and attached to the circuit board 200. Alternatively, the display driving circuit 300 may be directly attached to the second surface BS of the substrate 100 using a chip on glass (COG) method.

As shown in FIG. 1, the flexible film bent along the side surface of the substrate 100 may be removed by connecting the first driving pads PD1 disposed on the first surface FS and the second driving pads PD2 disposed on the second surface BS using a plurality of side wirings SIL. Accordingly, a bezel-less display device may be implemented.

Hereinafter, the structure of the pixel PX of the display device 10 according to one or more embodiments will be described.

Figure 3:
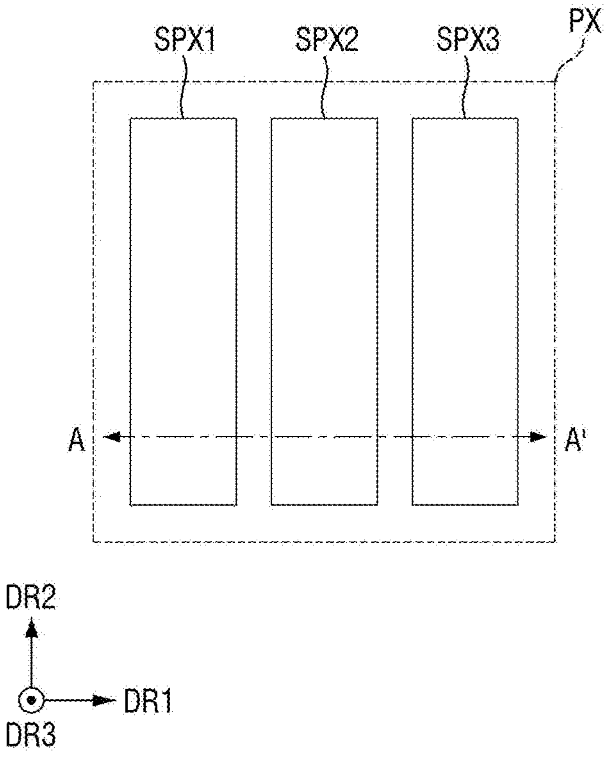
FIG. 3 is a diagram illustrating an example of a pixel of a display device according to one or more embodiments.
Figure 4:
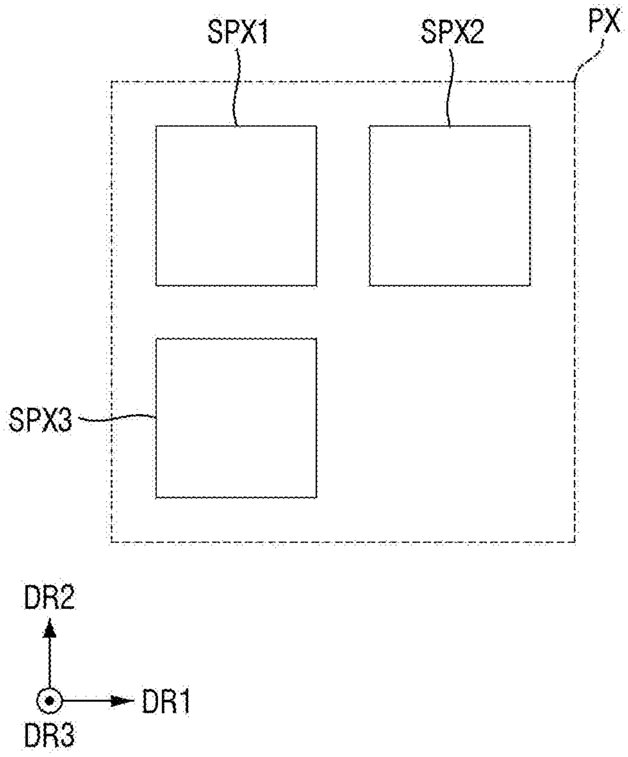
FIG. 4 is a diagram illustrating an example of a pixel of a display device according to one or more embodiments.

FIG. 3 is a diagram illustrating an example of a pixel of a display device according to one or more embodiments. FIG. 4 is a diagram illustrating an example of a pixel of a display device according to one or more embodiments.

Referring to FIGS. 3 and 4, each of the pixels PX may include a plurality of sub-pixels SPX1, SPX2, and SPX3. In FIGS. 3 and 4, each of the pixels PX includes three sub-pixels SPX1, SPX2, and SPX3, that is, a first sub-pixel SPX1, a second sub-pixel SPX2, and a third sub-pixel SPX3, but embodiments of the present disclosure are not limited thereto. Each of the first sub-pixel SPX1, the second sub-pixel SPX2, and the third sub-pixel SPX3 may be connected to one of the data lines and at least one scan line from among the scan lines.

Each of the first sub-pixel SPX1, the second sub-pixel SPX2, and the third sub-pixel SPX3 may have a rectangular, square, or rhombus planar shape. For example, each of the first sub-pixel SPX1, the second sub-pixel SPX2, and the third sub-pixel SPX3 may have a rectangular planar shape having a short side in the first direction DR1 and a long side in the second direction DR2 as shown in FIG. 3. Alternatively, each of the first sub-pixel SPX1, the second sub-pixel SPX2, and the third sub-pixel SPX3 may have the square or rhombus planar shape including sides having the same length in the first direction DR1 and the second direction DR2 as shown in FIG. 4.

As shown in FIG. 3, the first sub-pixel SPX1, the second sub-pixel SPX2, and the third sub-pixel SPX3 may be arranged along the first direction DR1. Alternatively, any one of the second sub-pixel SPX2 and the third sub-pixel SPX3 and the first sub-pixel SPX1 may be arranged along the first direction DR1, and the other one and the first sub-pixel SPX1 may be arranged along the second direction DR2. For example, as shown in FIG. 4, the first sub-pixel SPX1 and the second sub-pixel SPX2 may be arranged along the first direction DR1, and the first sub-pixel SPX1 and the third sub-pixel SPX3 may be arranged along the second direction DR2.

Alternatively, any one of the first sub-pixel SPX1 and the third sub-pixel SPX3 and the second sub-pixel SPX2 may be arranged along the first direction DR1, and the other one and the second sub-pixel SPX2 may be arranged along the second direction DR2. Alternatively, any one of the first sub-pixel SPX1 and the second sub-pixel SPX2 and the third sub-pixel SPX3 may be arranged along the first direction DR1, and the other one and the third sub-pixel SPX3 may be arranged along the second direction DR2.

The first sub-pixel SPX1 may emit a first light, the second sub-pixel SPX2 may emit a second light, and the third sub-pixel SPX3 may emit a third light. Here, the first light may be light of a red wavelength band, the second light may be light of a green wavelength band, and the third light may be light of a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm, but embodiments of the present disclosure are not limited thereto.

Each of the first sub-pixel SPX1, the second sub-pixel SPX2, and the third sub-pixel SPX3 may include an inorganic light emitting element including an inorganic semiconductor as a light emitting element that emits light. For example, the inorganic light emitting element may be a flip chip type micro LED (Light Emitting Diode), but embodiments of the present disclosure are not limited thereto.

As shown in FIGS. 3 and 4, an area of the first sub-pixel SPX1, an area of the second sub-pixel SPX2, and an area of the third sub-pixel SPX3 may be substantially the same but embodiments of the present disclosure are not limited thereto. At least one of the area of the first sub-pixel SPX1, the area of the second sub-pixel SPX2, and the area of the third sub-pixel SPX3 may be different from another one. Alternatively, any two of the area of the first sub-pixel SPX1, the area of the second sub-pixel SPX2, and the area of the third sub-pixel SPX3 may be substantially the same and the other one may be different from the two above. Alternatively, the area of the first sub-pixel SPX1, the area of the second sub-pixel SPX2, and the area of the third sub-pixel SPX3 may be different from each other.

Figure 5:
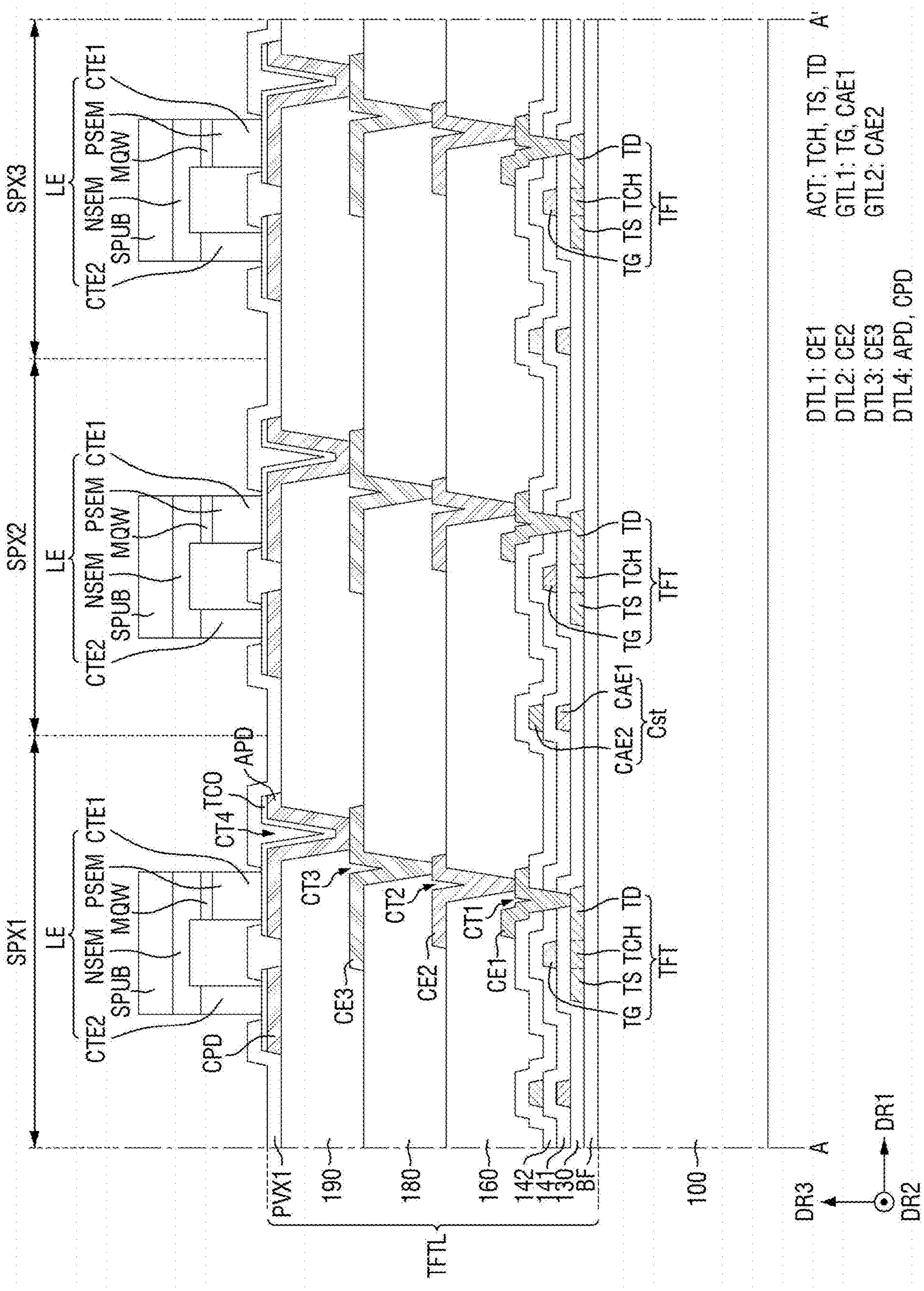
FIG. 5 is an example of a cross-sectional structure of a pixel taken along the line A-A' of FIG. 3.

FIG. 5 is an example of a cross-sectional structure of a pixel taken along the line A-A' of FIG. 3.

Referring to FIG. 5, each of the plurality of sub-pixels SPX1, SPX2, and SPX3 constituting the pixel PX may include a thin film transistor layer TFTL and light emitting elements LE disposed on the substrate 100. The thin film transistor layer TFTL may include a plurality of conductive layers and a plurality of insulating layers and may be a layer in which the thin film transistors TFT transmitting an electric signal of the light emitting element LE are formed.

The thin film transistor layer TFTL includes an active layer ACT, a first gate layer GTL1, a second gate layer GTL2, a first data metal layer DTL1, a second data metal layer DTL2, a third data metal layer DTL3, and a fourth data metal layer DTL4 as a conductive layer. In addition, the thin film transistor layer TFTL includes a buffer layer BF, a gate insulating layer 130, a first interlayer insulating layer 141, a second interlayer insulating layer 142, a first planarization layer 160, a second planarization layer 180, and a third planarization layer 190. In addition, the thin film transistor layer TFTL includes a first passivation layer PVX1 formed on the third planarization layer 190.

The substrate 100 may be a base substrate or a base member for supporting the display device 10. The substrate 100 may be a rigid substrate made of a glass material, but embodiments of the present disclosure are not limited thereto. The substrate 100 may be a flexible substrate capable of bending, folding, rolling, or the like. In this case, the substrate 100 may include an insulating material such as a polymer resin such as polyimide PI.

The buffer layer BF may be disposed on one surface of the substrate 100. The buffer film BF may be a film for preventing penetration of air or moisture. The buffer layer BF may be made of a plurality of inorganic layers alternately stacked. For example, the buffer layer BF may be formed as a multilayer in which one or more inorganic layers of silicon nitride layer, silicon oxynitride layer, silicon oxide layer, titanium oxide layer, and aluminum oxide layer are alternately stacked. The buffer layer BF may be omitted.

The active layer ACT may be disposed on the buffer layer BF. The active layer ACT may include a silicon semiconductor such as polycrystalline silicon, single crystal silicon, low-temperature polycrystalline silicon, and amorphous silicon, or an oxide semiconductor.

The active layer ACT may include a channel TCH, a first electrode TS, and a second electrode TD of the thin film transistor TFT. The channel TCH of the thin film transistor TFT may be an area overlapping the gate electrode TG of the thin film transistor TFT in the third direction DR3, which is the thickness direction of the substrate 100. The first electrode TS of the thin film transistor TFT may be disposed on one side of the channel TCH, and the second electrode TD may be disposed on the other side of the channel TCH. The first electrode TS and the second electrode TD of the thin film transistor TFT may be areas that do not overlap the gate electrode TG in the third direction DR3. The first electrode TS and the second electrode TD of the thin film transistor TFT may be areas having conductivity by doping ions in a silicon semiconductor or an oxide semiconductor.

The gate insulating layer 130 may be disposed on the active layer ACT and the buffer layer BF. The gate insulating layer 130 may be formed of an inorganic layer, for example, a silicon nitride layer, a silicon oxynitride layer, a silicon oxide layer, a titanium oxide layer, or an aluminum oxide layer.

The first gate layer GTL1 may be disposed on the gate insulating layer 130. The first gate layer GTL1 may include a gate electrode TG of the thin film transistors TFT and a first capacitor electrode CAE1. The first gate layer GTL1 may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

A first interlayer insulating layer 141 may be disposed on the first gate layer GTL1 and the gate insulating layer 130. The first interlayer insulating layer 141 may be formed of the inorganic layer, for example, the silicon nitride layer, the silicon oxynitride layer, the silicon oxide layer, the titanium oxide layer, or the aluminum oxide layer.

The second gate layer GTL2 may be disposed on the first interlayer insulating layer 141. The second gate layer GTL2 may include a second capacitor electrode CAE2. The second capacitor electrode CAE2 and the first capacitor electrode CAE1 may use the first interlayer insulating layer 141 as a dielectric to form the capacitor Cst. The second gate layer GTL2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second interlayer insulating layer 142 may be disposed on the second gate layer GTL2 and the first interlayer insulating layer 141. The second interlayer insulating layer 142 may be formed of an inorganic layer, for example, the silicon nitride layer, the silicon oxynitride layer, the silicon oxide layer, the titanium oxide layer, or the aluminum oxide layer.

The first data metal layer DTL1 may be disposed on the second interlayer insulating layer 142. The first data metal layer DTL1 may include a first connection electrode CE1. The first connection electrode CE1 may be connected to the second electrode TD of the thin film transistor TFT through a first contact hole CT1 penetrating the gate insulating layer 130, the first interlayer insulating layer 141, and the second interlayer insulating layer 142. The present disclosure is not limited thereto, and the first connection electrode CE1 may be connected to the first electrode TS.

The first data metal layer DTL1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. In one or more embodiments, as will be described later, the first data metal layer DTL1 may further include a first sub pad (SPD1 of FIG. 11) and a data line (DL of FIG. 11). The data line DL may be integrally formed with a first sub pad SPD1, but embodiments of the present disclosure are not limited thereto.

A first planarization film 160 may be disposed on the first data metal layer DTL1 and the second interlayer insulating layer 142 for flattening a step caused by the active layer ACT, the first gate layer GTL1, the second gate layer GTL2, and the first data metal layer DTL1. The first planarization film 160 is formed of an organic film such as acrylic resin, epoxy resin, phenolic resin, polyamide resin, polyimide resin, etc.

The second data metal layer DTL2 may be disposed on the first planarization layer 160. The second data metal layer DTL2 may include a second connection electrode CE2. The second connection electrode CE2 may be connected to the first connection electrode CE1 through a second contact hole CT2 penetrating the first planarization film 160. The second data metal layer DTL2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. In one or more embodiments, as will be described later, the second data metal layer DTL2 may further include a second sub pad (SPD2 of FIG. 11).

In one or more embodiments, a first insulating layer may be formed between the first planarization layer 160 and the second data metal layer DTL2. The first insulating layer may be formed of an inorganic layer, for example, a silicon nitride layer, a silicon oxynitride layer, a silicon oxide layer, a titanium oxide layer, or an aluminum oxide layer. The first insulating layer may be omitted.

The second planarization layer 180 may be disposed on the second data metal layer DTL2 and the first planarization layer 160. The second planarization layer 180 is formed of an organic film such as acrylic resin, epoxy resin, phenolic resin, polyamide resin, polyimide resin, etc.

The third data metal layer DTL3 may be disposed on the second planarization layer 180. The third data metal layer DTL3 may include a third connection electrode CE3. The third connection electrode CE3 may be connected to the second connection electrode CE2 through a third contact hole CT3 penetrating the second planarization layer 180. The third data metal layer DTL3 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. In one or more embodiments, the third data metal layer DTL3 may further include a third sub pad (SPD3 of FIG. 11).

In one or more embodiments, a second insulating layer may be formed between the second planarization layer 180 and the third data metal layer DTL3. The second insulating layer may be formed of an inorganic layer, for example, a silicon nitride layer, a silicon oxynitride layer, a silicon oxide layer, a titanium oxide layer, or an aluminum oxide layer. The second insulating layer may be omitted.

The third planarization layer 190 may be disposed on the third data metal layer DTL3 and the second planarization layer 180. The third planarization layer 190 may be formed of an organic film such as acrylic resin, epoxy resin, phenolic resin, polyamide resin, polyimide resin, etc.

A fourth data metal layer DTL4 may be disposed on the third planarization layer 190. The fourth data metal layer DTL4 may include pad electrodes, for example, an anode pad electrode APD and a cathode pad electrode CPD. The anode pad electrode APD may be connected to the third connection electrode CE3 through a fourth contact hole CT4 penetrating the third planarization layer 190. The cathode pad electrode CPD may receive a low potential voltage. The fourth data metal layer DTL4 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. In one or more embodiments, the fourth data metal layer DTL4 may further include a fourth sub pad (SPD4 of FIG. 11).

A transparent metal material or transparent conductive oxide (TCO) for increasing adhesion to the first contact electrode CTE1 and the second contact electrode CTE2 of the light emitting element LE may be disposed on the pad electrodes. For example, the transparent metal material TCO may increase the adhesion between the anode pad electrode APD and the first contact electrode CTE1 and between the cathode pad electrode CPD and the second contact electrode CTE2. The transparent metal material TCO may be formed of a transparent conductive oxide such as indium tin oxide (ITO) and indium zinc oxide (IZO). In one or more embodiments, the transparent metal material TCO may be disposed on the uppermost end of the first driving pad PD1 of FIG. 11.

In one or more embodiments, a third insulating layer may be formed between the third planarization layer 190 and the fourth data metal layer DTL4. The third insulating layer may be formed of an inorganic layer, for example, a silicon nitride layer, a silicon oxynitride layer, a silicon oxide layer, a titanium oxide layer, or an aluminum oxide layer. The third insulating layer may be omitted.

A first passivation layer PVX1 may be disposed on the anode pad electrode APD and the cathode pad electrode CPD. The first passivation layer PVX1 may be disposed to cover edges of the anode pad electrode APD and the cathode pad electrode CPD. The first passivation layer PVX1 may be formed of an inorganic layer, for example, a silicon nitride layer, a silicon oxynitride layer, a silicon oxide layer, a titanium oxide layer, or an aluminum oxide layer.

The light emitting element LE may be disposed on the anode pad electrode APD and the cathode pad electrode CPD that are not covered by the first passivation layer PVX1. It was exemplified that the light emitting element LE is a flip-chip type micro LED in which the first contact electrode CTE1 opposes the anode pad electrode APD and the second contact electrode CTE2 opposes the cathode pad electrode CPD. The light emitting element LE may include an inorganic material such as GaN. The length of the light emitting element LE in the horizontal direction (i.e., the first direction DR1 or the second direction DR2) and the length of the third direction DR3 may be several to several hundreds of μm, respectively.

The light emitting element LE may be formed by growing on a semiconductor substrate such as a silicon wafer. The light emitting element LE may be directly transferred onto the anode pad electrode APD and the cathode pad electrode CPD of the substrate 100 from the silicon wafer. Alternatively, the light emitting element LE may be transferred onto the anode pad electrode APD and the cathode pad electrode CPD of the substrate 100 through an electrostatic method using an electrostatic head or a stamp method using an elastic polymer material such as PDMS or silicon as a transfer substrate.

The light emitting element LE may be a light emitting structure including a base substrate SPUB, an n-type semiconductor NSEM, an active layer MQW, a p-type semiconductor PSEM, a first contact electrode CTE1, and a second contact electrode CTE2.

The base substrate SPUB may be a sapphire substrate, but embodiments of the present disclosure are not limited thereto.

The n-type semiconductor NSEM may be disposed on one surface of the base substrate SPUB. For example, the n-type semiconductor NSEM may be disposed on the lower surface of the base substrate SPUB. The n-type semiconductor NSEM may be made of GaN doped with an n-type conductivity-type dopant such as Si, Ge, Sn, or Se.

The active layer MQW may be disposed on a part of one surface of the n-type semiconductor NSEM. The active layer MQW may form a bond of an electron-hole pair according to an electrical signal through an electron of the n-type semiconductor NSEM and a hole of the p-type semiconductor PSEM and may emit light. The active layer may include a material having a single or multiple quantum well structure. When the active layer contains a material having a multiple quantum well structure, the active layer may have the structure in which a plurality of well layers and barrier layers are alternately laminated. In this case, the well layer may be formed of InGaN, and the barrier layer may be formed of GaN or AlGaN but is not limited thereto. Alternatively, the active layer may have a structure in which semiconductor materials having large band gap energy and semiconductor materials having small band gap energy are alternately stacked and may include other Group III to Group V semiconductor materials according to the wavelength band of the emitted light.

The p-type semiconductor PSEM may be disposed on one surface of the active layer MQW. The p-type semiconductor PSEM may be made of GaN doped with a p-type conductivity-type dopant such as Mg, Zn, Ca, Se, or Ba.

The first contact electrode CTE1 may be disposed on the p-type semiconductor PSEM and the second contact electrode CTE2 may be disposed on another part of one surface of the n-type semiconductor NSEM. Another part of one surface of the n-type semiconductor NSEM on which the second contact electrode CTE2 is disposed may be disposed apart from a part of one surface of the n-type semiconductor NSEM on which the active layer MQW is disposed.

The first contact electrode CTE1 and the anode pad electrode APD may be bonded to each other through the conductive adhesive member. Alternatively, the first contact electrode CTE1 and the anode pad electrode APD may be bonded to each other through a soldering process.

The second contact electrode CTE2 and the cathode pad electrode CPD may be bonded to each other through the conductive adhesive member. Alternatively, the second contact electrode CTE2 and the common pad electrode CPD may be bonded to each other through the soldering process.

Figure 6:
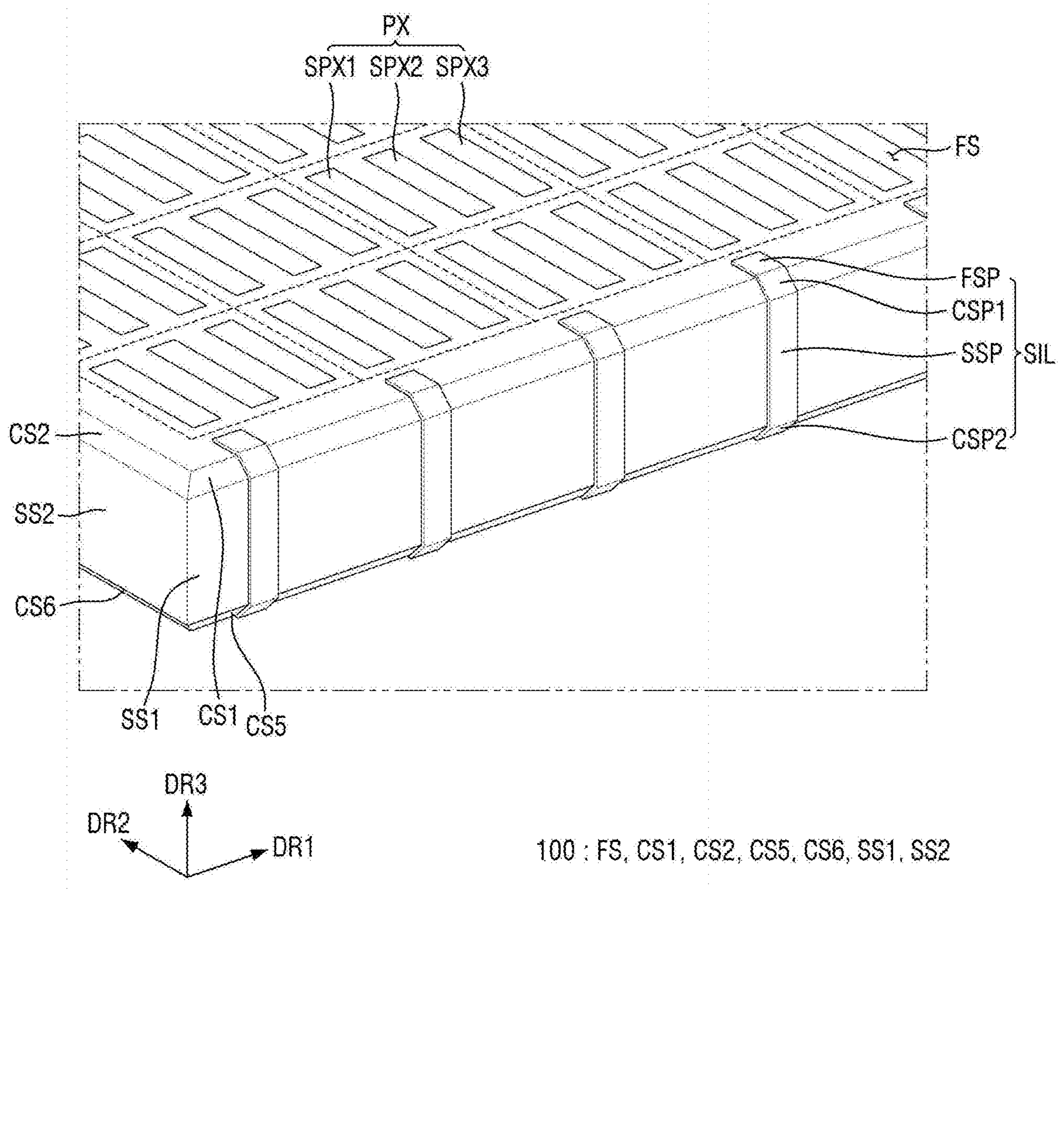
FIG. 6 is a perspective view illustrating an arrangement relationship between pixels and side wirings of a display device according to one or more embodiments.
Figure 7:
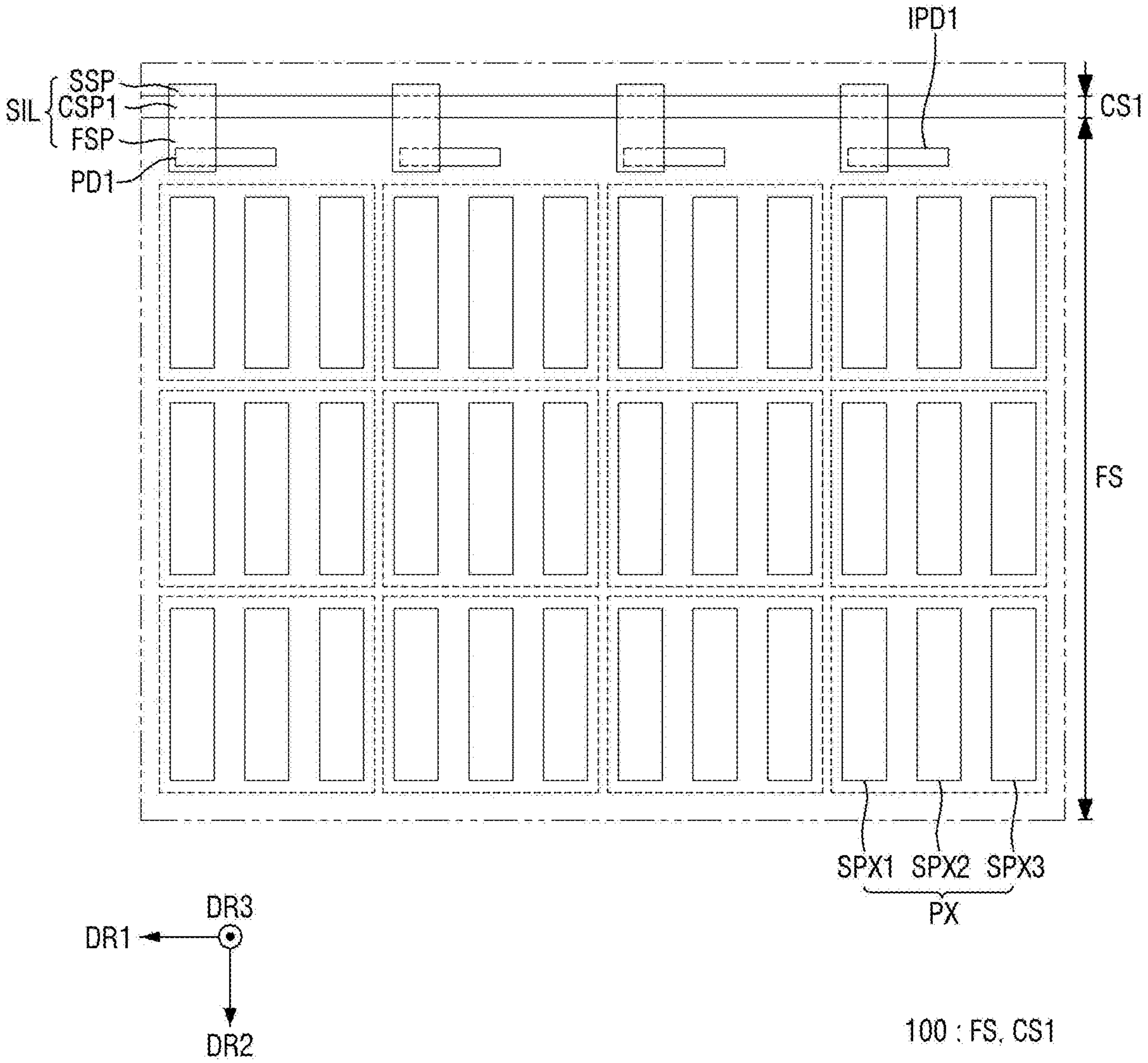
FIG. 7 is a plan view illustrating an arrangement relationship between pixels and side wirings of a display device according to one or more embodiments.
Figure 8:
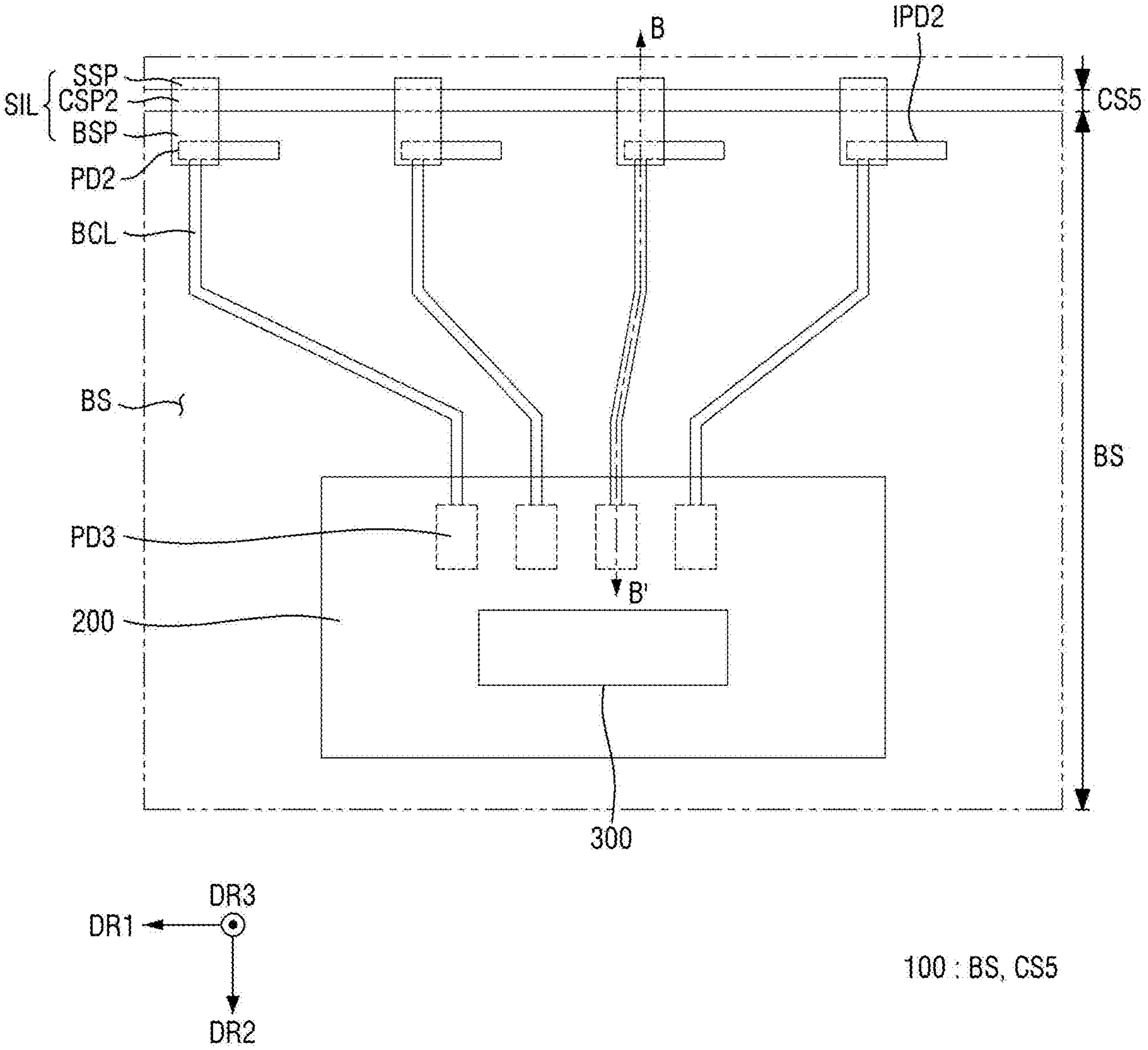
FIG. 8 is a rear view illustrating an arrangement relationship between pixels and side wirings of a display device according to one or more embodiments.

FIG. 6 is a perspective view illustrating an arrangement relationship between pixels and side wirings of a display device according to one or more embodiments. FIG. 7 is a plan view illustrating an arrangement relationship between pixels and side wirings of a display device according to one or more embodiments. FIG. 8 is a rear view illustrating an arrangement relationship between pixels and side wirings of a display device according to one or more embodiments.

Referring to FIGS. 6 to 8, the display device 10 according to one or more embodiments includes first driving pads PD1, second driving pads PD2, third driving pads PD3, and a bottom connection lines BCL. Also, the display device 10 includes the first inspection pads IPD1 and the second inspection pads IPD2.

The first driving pads PD1 may be front pads disposed on the first surface FS corresponding to the front surface of the substrate 100. The first driving pads PD1 may be disposed at an edge of the first side of the first surface FS of the substrate 100. The first driving pads PD1 may be arranged along the first direction DR1.

The second driving pads PD2 may be rear pads disposed on the second surface BS corresponding to the bottom surface of the substrate 100. The second driving pads PD2 may be disposed at an edge of the first side of the second surface BS of the substrate 100. The second driving pads PD2 may be arranged along the first direction DR1.

The third driving pads PD3 may be rear pads disposed on the second surface BS of the substrate 100. The third driving pads PD3 may be disposed closer to the center of the second surface BS of the substrate 100 than the second driving pads PD2. The third driving pads PD3 may be arranged along the first direction DR1. The distance between the third driving pads PD3 adjacent to each other in the first direction DR1 may be smaller than the distance between the second driving pads PD2 adjacent to each other in the first direction DR1 to connect more third driving pads PD3 to the circuit board 200.

The bottom connection line BCL serves to connect the second driving pad PD2 and the third driving pads PD3. Because the spacing between the second driving pads PD2 adjacent to each other in the first direction DR1 and the spacing between the third driving pads PD3 adjacent to each other in the first direction DR1 are different from each other, the bottom connection line BCL may be bent at least once. The bottom connection line BCL may be integrally formed with the second driving pad PD2 and the third driving pad PD3. The second driving pad PD2, the third driving pad PD3, and the bottom connection line BCL may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The side wiring SIL may include a front surface part FSP, a first inclined part CSP1, a side surface part SSP, a second inclined part CSP2, and a bottom surface part BSP.

The front surface part FSP corresponds to a part disposed on the first surface FS of the substrate 100. The front surface part FSP may be disposed on the first driving pad PD1 and may be disposed to completely cover the first driving pad PD1. The front surface part FSP may be connected to the first driving pad PD1.

The first inclined part CSP1 corresponds to the first chamfered part disposed on the first chamfered surface CS1 of the substrate 100. The first inclined part CSP1 may be disposed between the front surface part FSP and the side surface part SSP.

The side surface part SSP corresponds to a side part disposed on the first side surface SS1 of the substrate 100. The side surface part SSP may be disposed between the first inclined part CSP1 and the second inclined part CSP2.

The second inclined part CSP2 corresponds to the second chamfered part disposed on the fifth chamfered surface CS5 of the substrate 100. The second inclined part CSP2 may be disposed between the side surface part SSP and the bottom surface part BSP.

The bottom surface part BSP corresponds to a part disposed on the second surface BS of the substrate 100. The bottom surface part BSP is disposed on the second driving pad PD2 and may be disposed to completely cover the second driving pad PD2. The bottom surface part BSP may be connected to the second driving pad PD2.

The side wiring SIL may include a metal powder including metal particles such as silver (Ag) and copper (Cu) and a polymer such as an acrylic resin or an epoxy resin. The metal powder may allow the side wiring SIL to have conductivity and the polymer may serve as a binder connecting the metal particles.

Specifically, the side wiring SIL may be formed by sintering using a laser after printing a metal paste including metal particles, a monomer, and a solution on the substrate 100 using a silicon pad. The side wiring SIL may have a low specific resistance the monomer reacts to the polymer by the heat of the laser as the metal particles adhere to each other and agglomerate during the sintering process. The side wiring SIL may be formed in a way that wraps around the front surface part FSP, the first inclined part CSP1, the side surface part SSP, the second inclined part CSP2, and the bottom surface part BSP.

Each of the first inspection pads IPD1 and the second inspection pads IPD2 may be an inspection pad for inspecting whether there is a disconnection between the first driving pad PD1 and the side wiring SIL and between the second driving pad PD2 and the side wiring SIL. Each of the first inspection pads IPD1 may be integrally formed with the first driving pad PD1. Each of the second inspection pads IPD2 may be integrally formed with the second driving pad PD2.

The first inspection pad IPD1 may be a front inspection pad disposed on the first surface FS of the substrate 100. The first inspection pads IPD1 may be disposed adjacent to the first driving pad PD1 at an edge of the first side of the first surface FS of the substrate 100. The first inspection pads IPD1 may be arranged along the first direction DR1. Because the first inspection pad IPD1 is directly connected to the first driving pad PD1, it may be inspected whether the side wiring SIL attached to the first driving pad PD1 is shorted or opened using the first inspection pad IPD1.

The second inspection pad IPD2 may be a front inspection pad disposed on the second surface BS of the substrate 100. The second inspection pads IPD2 may be disposed adjacent to the second driving pad PD2 at the edge of the first side of the second surface BS of the substrate 100. The second inspection pads IPD2 may be arranged along the first direction DR1. Because the second inspection pad IPD2 is directly connected to the second driving pad PD2, it may be inspected whether the side wiring SIL attached to the second driving pad PD2 is shorted or opened using the second inspection pad IPD2.

A method of inspecting the side wiring SIL through the first inspection pad IPD1 and the second inspection pad IPD2 will be described later with reference to FIG. 19.

In the embodiment of FIGS. 6-8, one pixel PX is connected to one first driving pad PD1 and one first inspection pad IPD1 but is not limited thereto.

Figure 9A:
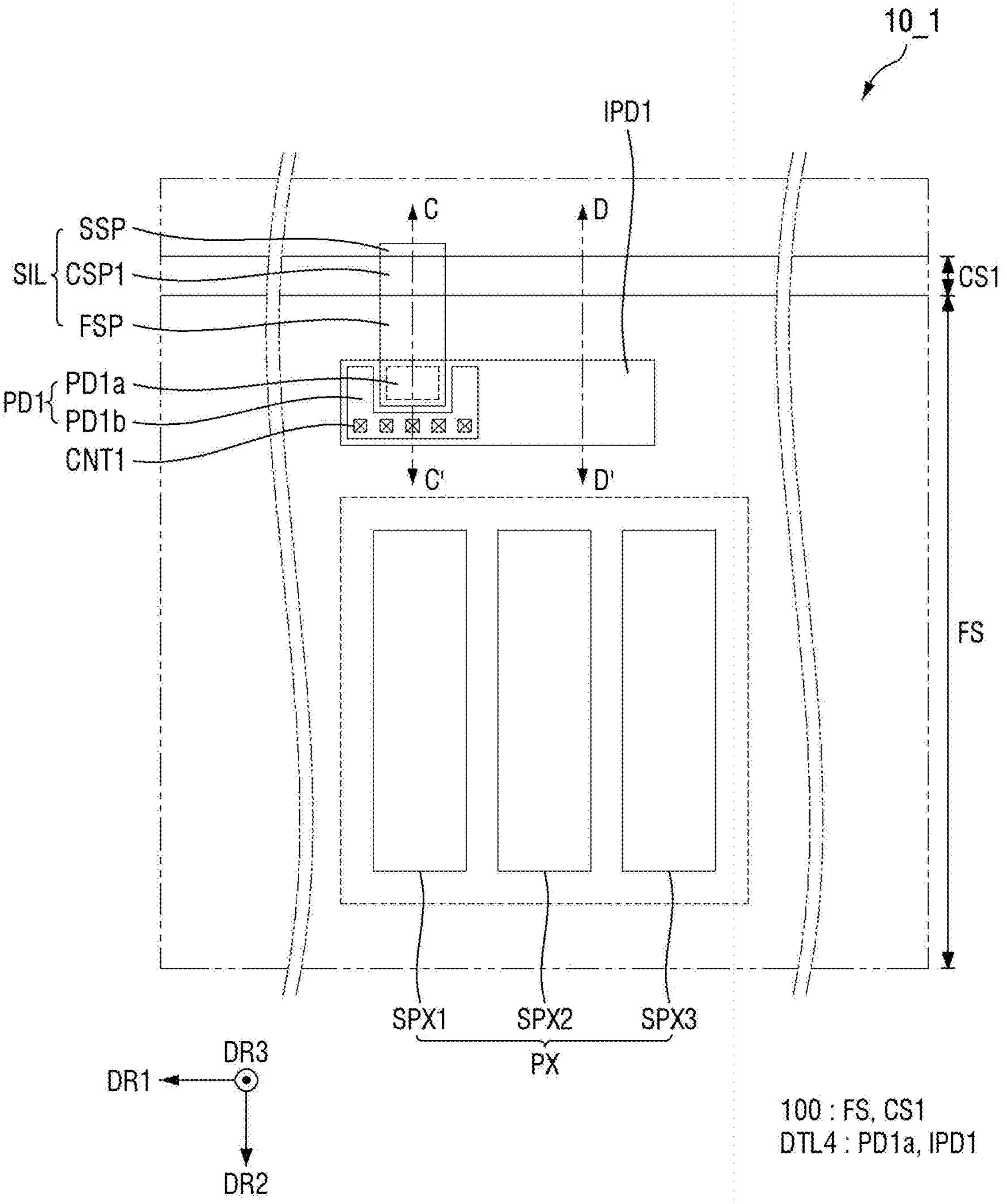
FIG. 9A is a plan view illustrating one edge of a display device according to one or more embodiments.

FIG. 9A is a plan view illustrating one edge of a display device according to one or more embodiments. FIGS. 9B to 9F are plan views illustrating stacking of the first driving pad, sub pads of the first inspection pad, and a transparent metal material according to one or more embodiments. FIG. 10 is a perspective view illustrating one edge of a display device according to one or more embodiments.

Figure 9B:
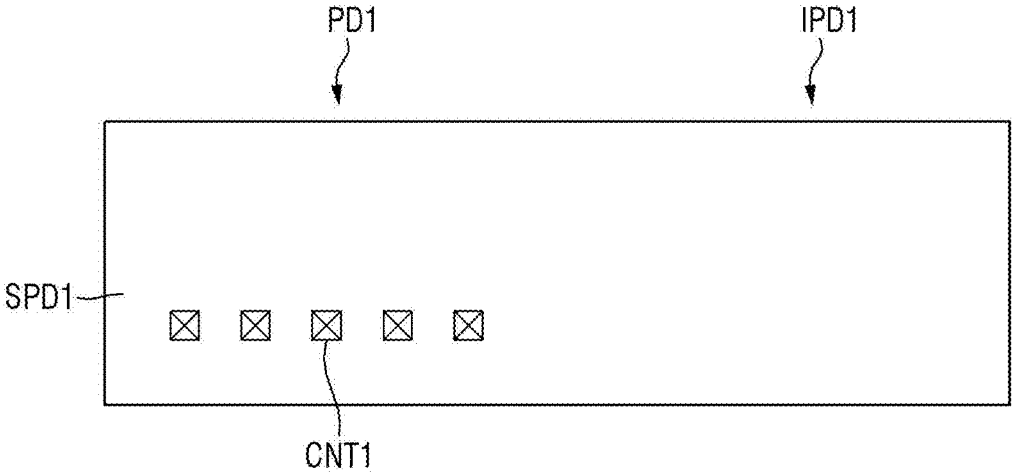
FIGS. 9B to 9F are plan views illustrating stacking of the first driving pad, sub pads of the first inspection pad, and a transparent metal material according to one or more embodiments.
Figure 9C:
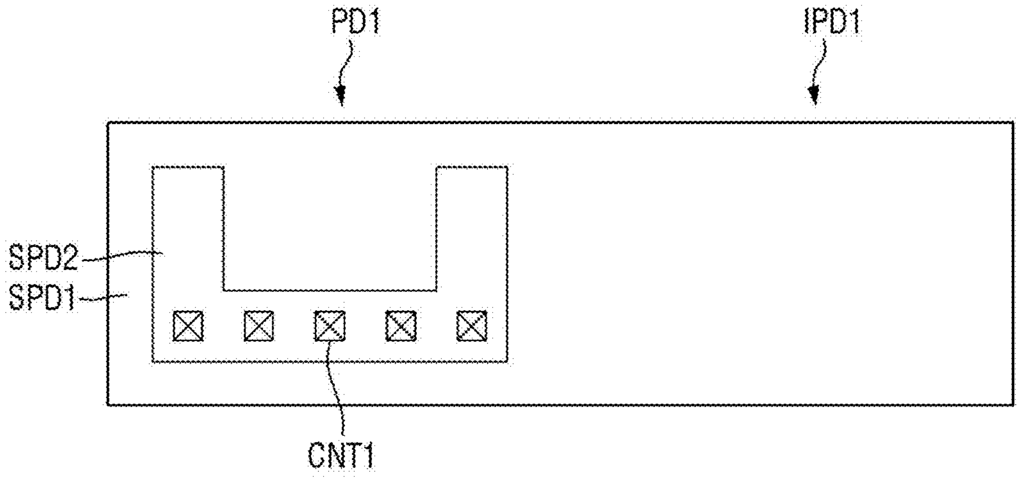
Figure 9D:
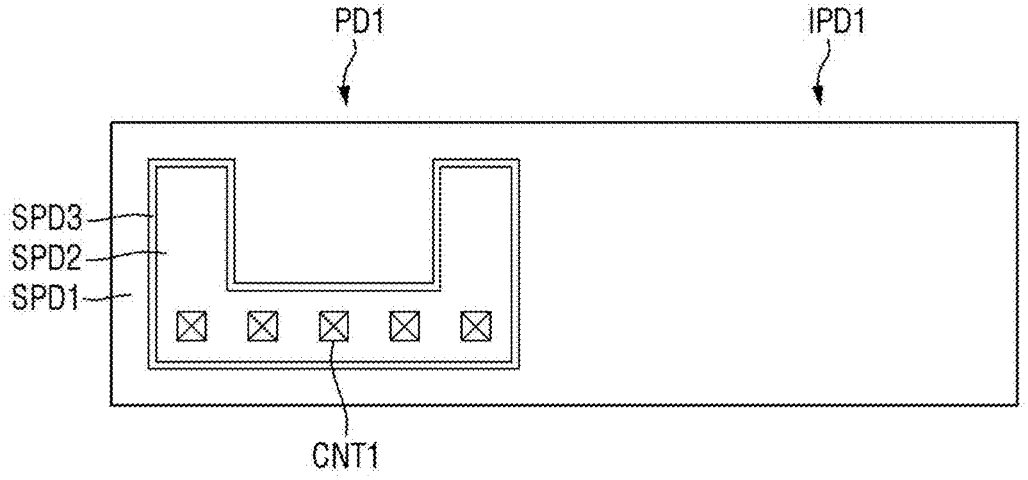
Figure 9E:
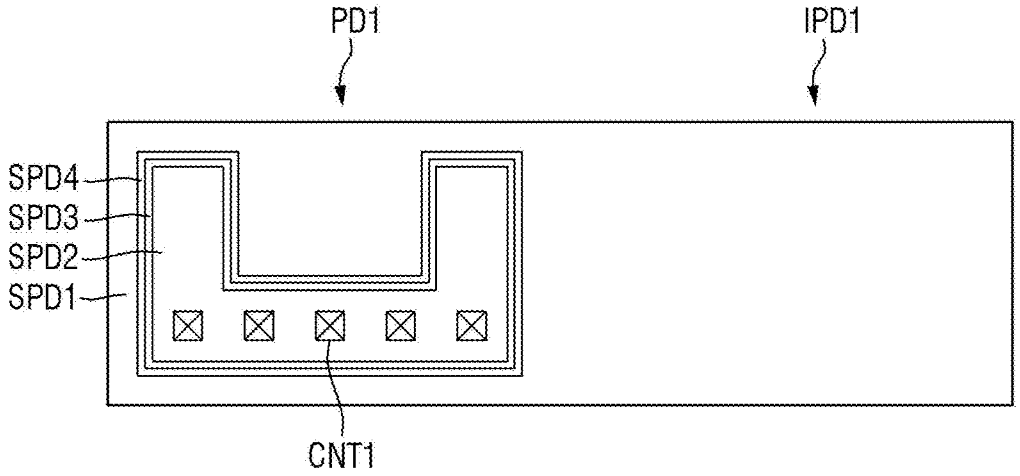
Figure 9F:
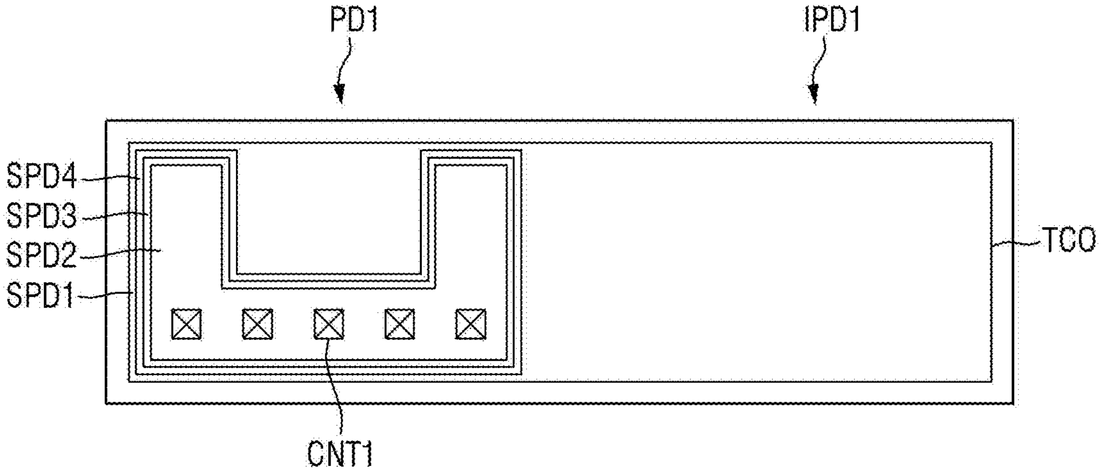
Figure 10:
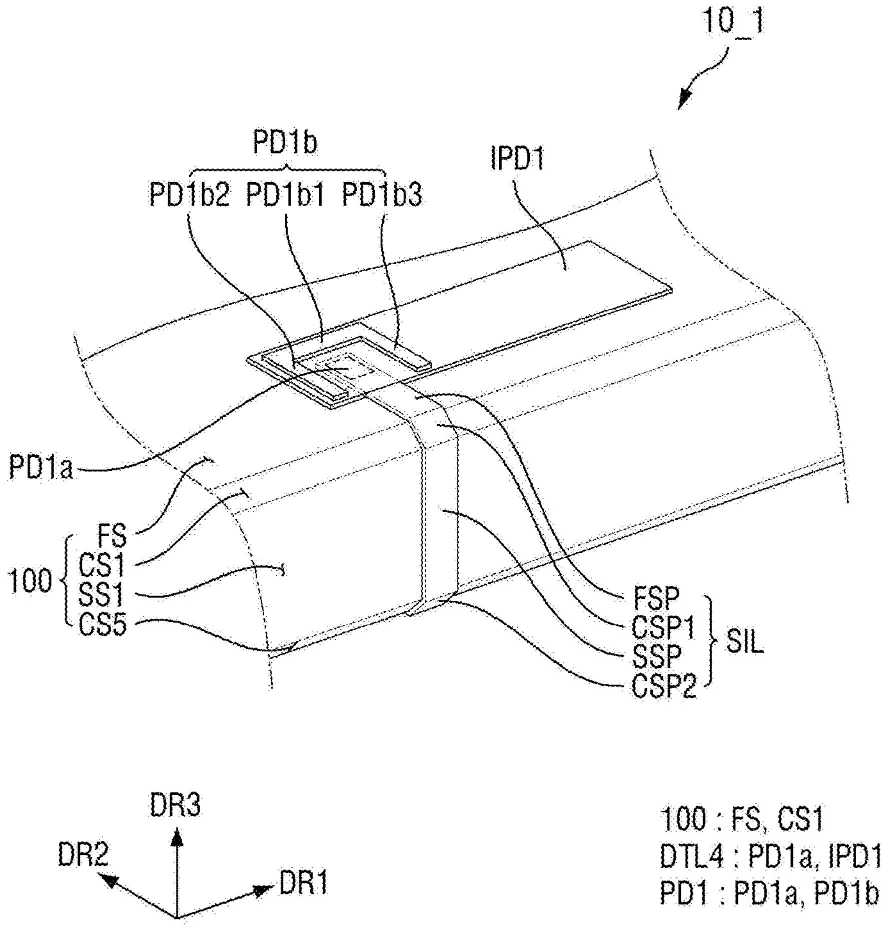
FIG. 10 is a perspective view illustrating one edge of a display device according to one or more embodiments.

For convenience of explanation, the first sub pad SPD1 is illustrated in FIG. 9B and the first sub pad SPD1 and the second sub pad SPD2 are illustrated in FIG. 9C. In FIG. 9D, the first to third sub pads SPD1, SPD2, and SPD3 are exemplified, the first to fourth sub pads SPD1, SPD2, SPD3, and SPD4 are exemplified in FIG. 9E, and the first to fourth sub pads SPD1, SPD2, SPD3, and SPD4 and the transparent metal material TCO are illustrated in FIG. 9F.

Referring to FIGS. 9A to 9F and 10, a display device 10_1 according to one or more embodiments may include a first driving pad PD1, a side wiring SIL, and a first inspection pad IPD1 disposed on a lower edge of a first surface FS.

The first driving pad PD1 may include a flat portion PD1*a* connected to the side wiring SIL and a partition wall portion PD1*b* surrounding three side surfaces of the flat portion PD1*a*. The partition wall portion PD1*b* may have a wall structure surrounding three side surfaces of the flat portion PD1*a*. The partition wall portion PD1*b* may be disposed between the pixel PX and the flat portion PD1*a*.

The flat portion PD1*a* may form a bottom surface of the first driving pad PD1. The flat portion PD1*a* is an area in direct contact with the side wiring SIL and may have one surface parallel to the first surface FS of the substrate 100, that is, a flat surface. The flat portion PD1*a* may be made of the fourth sub pad SPD4 formed of the fourth data metal layer DTL4 and the transparent metal material TCO. Also, because the flat portion PD1*a* does not include a contact portion connected to the lower line, it may have a flat surface without a step difference. The flat portion PD1*a* may have a rectangular shape in which a length in the first direction DR1 is longer than a length in the second direction DR2 but is not limited thereto.

The partition wall portion PD1*b* may be formed to be around (e.g., to surround) three side surfaces of the flat portion PD1*a*. When the side wiring SIL is printed, the partition wall portion PD1*b* may serve as a barrier or a confinement to confine the side wiring SIL to prevent the side wiring SIL from being printed beyond the partition wall portion PD1*b*. Accordingly, the side wiring SIL may not overlap the partition wall portion PD1*b* and may overlap the flat portion PD1*a*, but is not limited thereto.

The partition wall portion PD1*b* may be connected to the first portion PD1*b*1 extending in the first direction DR1 and one end of the first portion PD1*b*1, may be connected to the second portion PD1*b*2 extending in the second direction DR2 and the other end of the first portion PD1*b*1, and may be connected to the third portion PD1*b*3 extending in the second direction DR2 (e.g., see FIG. 10). The first portion PD1*b*1, the second portion PD1*b*2, and the third portion PD1*b*3 of the partition wall portion PD1*b* may be formed to be around (e.g., to surround) three side surfaces of the flat portion PD1*a*. The first portion PD1*b*1 may be disposed between the pixel PX and the flat portion PD1*a*. The first portion PD1*b*1 serves as a barrier rib disposed between the pixel PX and the flat portion PD1*a*, thereby preventing the side wiring SIL from overflowing toward the pixel PX. The partition wall portion PD1*b* may have a structure in which a plurality of data metal layers, for example, second to fourth sub pads SPD2, SPD3, and SPD4 are stacked. The partition wall portion PD1*b* may include a plurality of first contact portions CNT1 to which the first sub pad SPD1 is connected to the bottom wiring (BL of FIG. 13).

Figure 13:
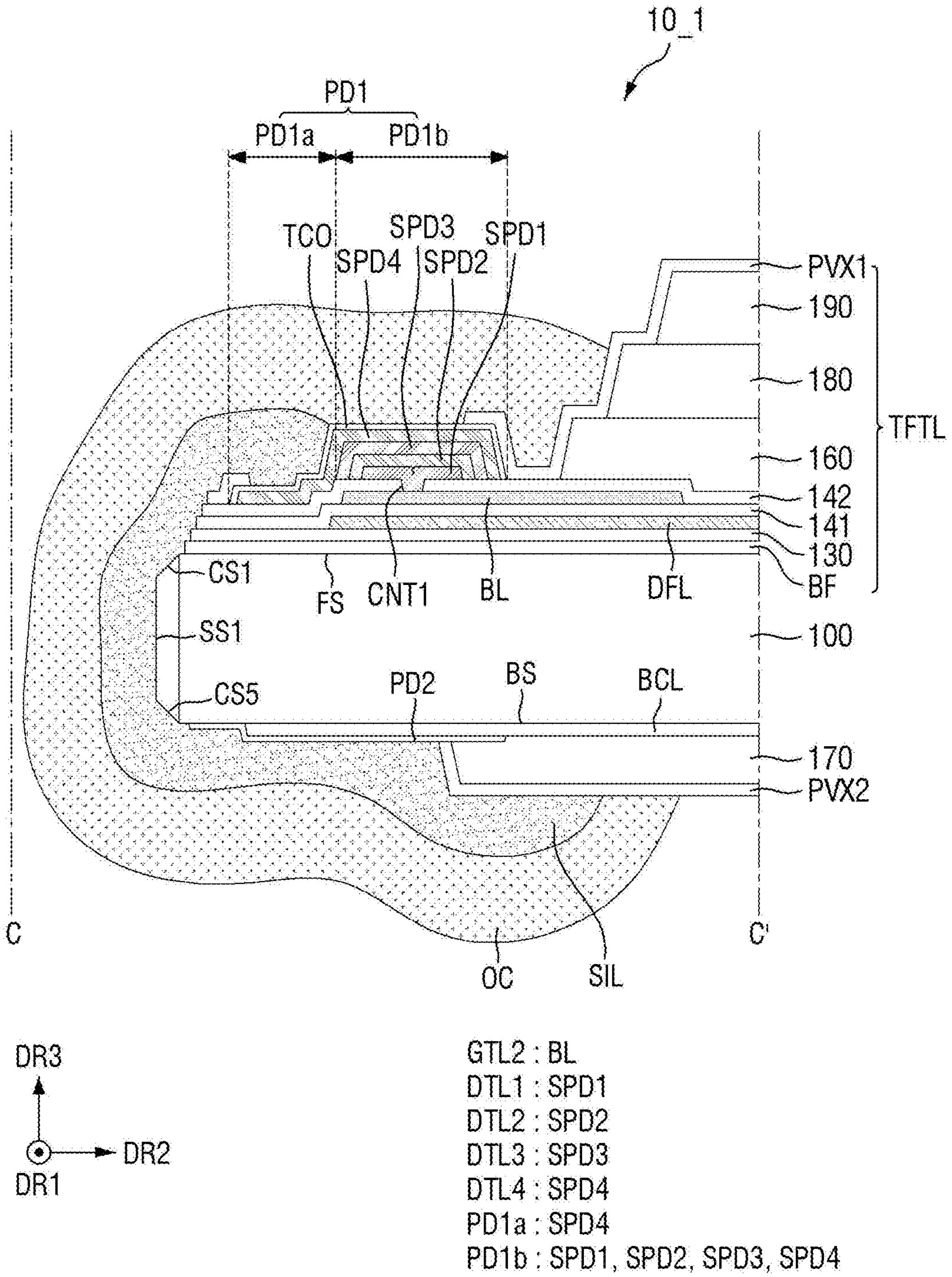
FIG. 13 is an example of a cross-sectional structure of the first driving pad taken along the line C-C' of FIG. 9A.

The flat portion PD1*a* includes the fourth sub pad SPD4 while a step may exist between the flat portion PD1*a* and the partition wall portion PD1*b* as the second to fourth sub pads SPD2, SPD3, and SPD4 are stacked in the partition wall portion PD1*b* (e.g., see FIG. 13). The thickness of the partition wall portion PD1*b* may be thicker than the thickness of the flat portion PD1*a*. The upper surface of the partition wall portion PD1*b* may exist at a position higher than the upper surface of the flat portion PD1*a*.

In summary, by forming the step difference through the flat portion PD1*a* and the partition wall portion PD1*b* of the first driving pad PD1, the wall structure for confining the side wiring SIL may be completed.

On the other hand, when the side wiring SIL is printed to be around (e.g., to surround) an area having a step difference due to a contact portion or a data metal layer from among the areas of the first driving pad PD1 without the wall structure, it may not properly contact the first driving pad PD1 because the side wiring SIL is lifted by the step. When the side wiring SIL does not properly contact the first driving pad PD1, the shape of the side wiring SIL is deformed, the length of the side wiring SIL is changed, or a contact resistance between the side wiring SIL and the first driving pad PD1 may be increased.

In contrast, the first driving pad PD1 may be formed to have a wall structure in which a step is formed through the flat portion PD1*a* and the partition wall portion PD1*b* to confine the side wiring SIL. In this case, when the side wiring SIL is printed, the side wiring SIL may not be disposed beyond the partition wall portion PD1*b* due to the wall role of the partition wall portion PD1*b*. Accordingly, when the side wiring SIL made of silver (Ag) is printed to be around (e.g., to surround) the first driving pad PD1, it is possible to prevent the shape of the side wiring SIL from being deformed or the length of the side wiring SIL from being changed. In addition, because the contact resistance between the side wiring SIL and the first driving pad PD1 may be stably maintained, image quality defects of the display device 10 caused by the contact resistance deviation may be improved.

The first inspection pad IPD1 may include the first sub pad SPD1 and the transparent metal material TCO. The first driving pad PD1 and the first inspection pad IPD1 may share the transparent metal material TCO with the first sub pad SPD1.

Figure 11:
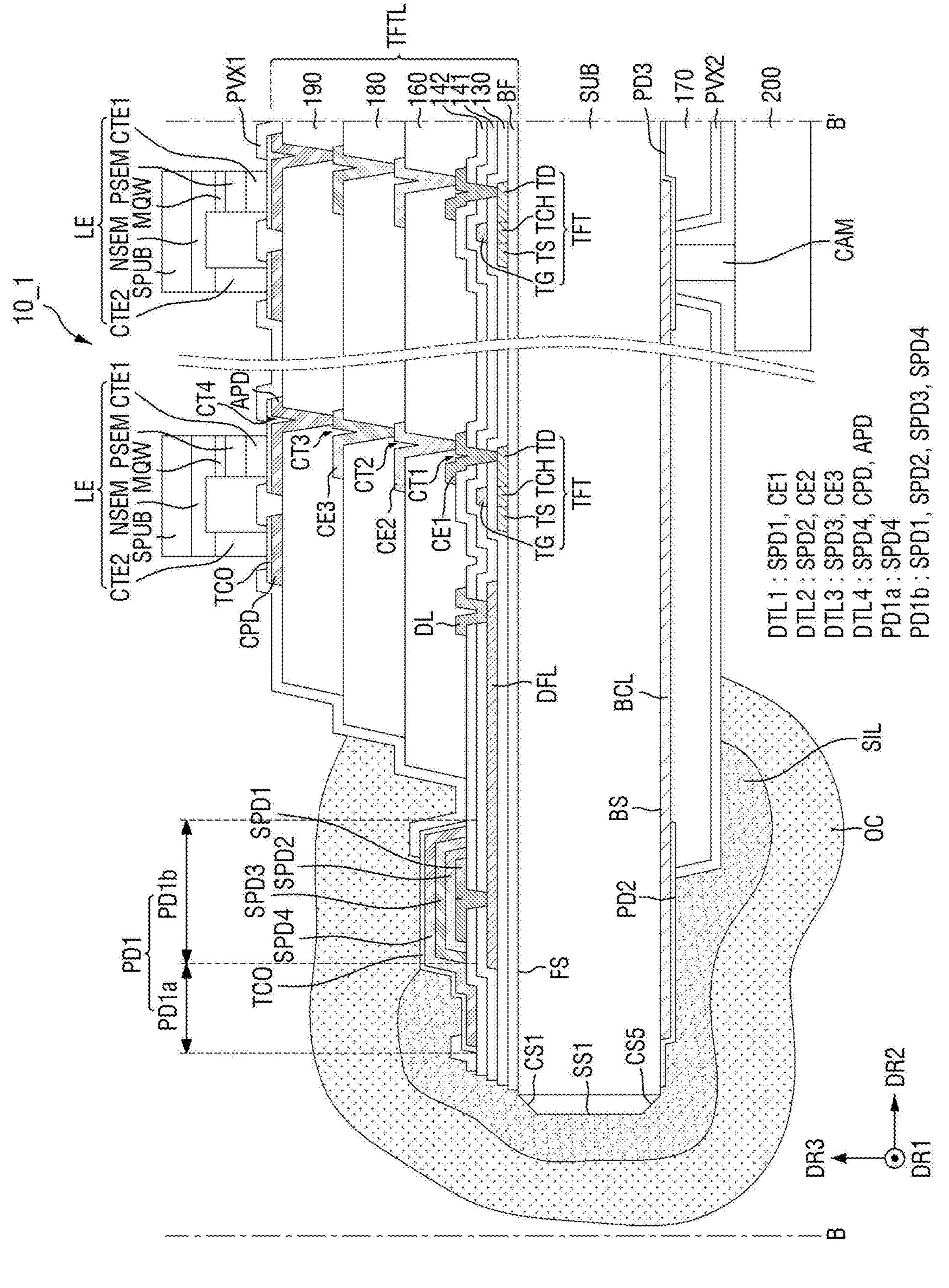
FIG. 11 is an example of a cross-sectional structure of a pixel taken along the line B-B' of FIG. 8.
Figure 12:
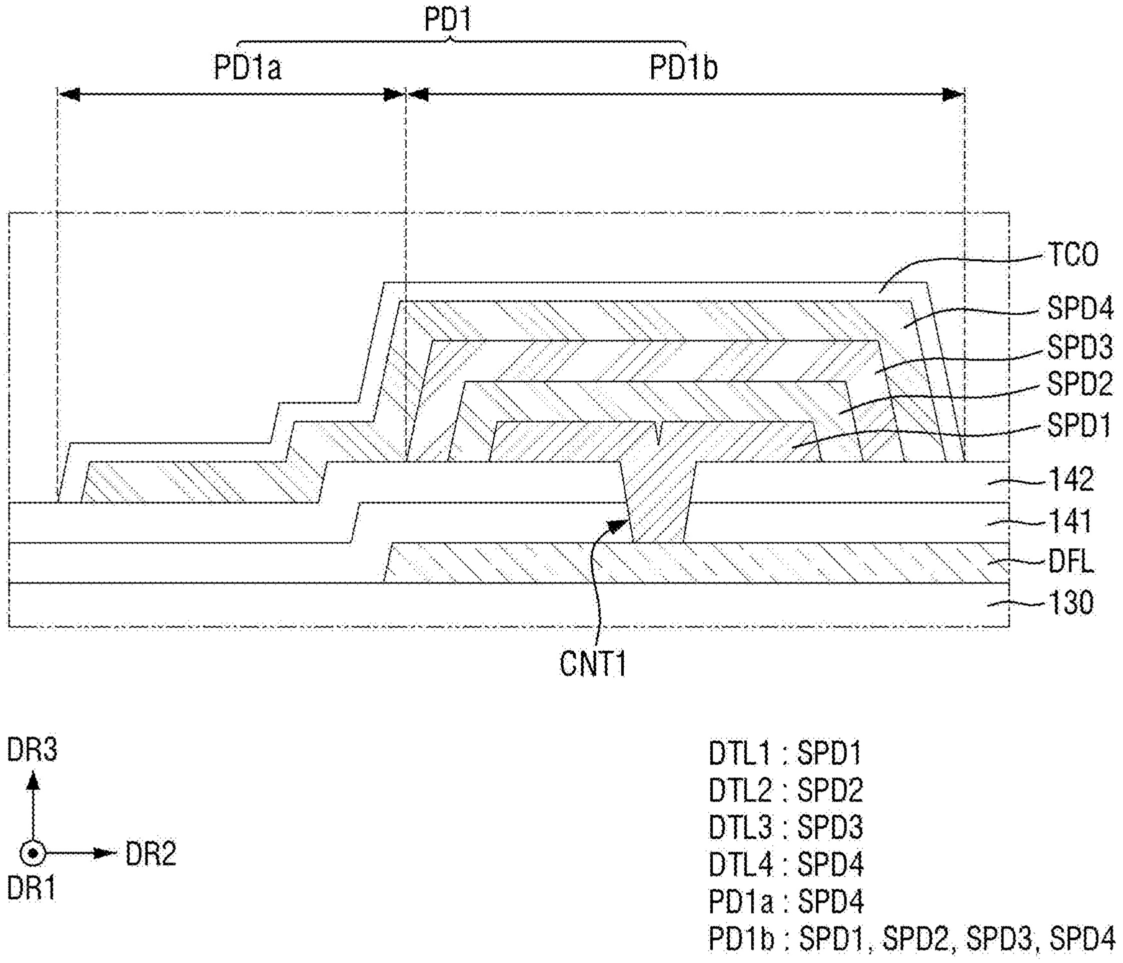
FIG. 12 is an enlarged cross-sectional view of the first driving pad of FIG. 11.

FIG. 11 is an example of a cross-sectional structure of a pixel taken along the line B-B' of FIG. 8. FIG. 12 is an enlarged cross-sectional view of the first driving pad of FIG. 11. In FIGS. 11 and 12, descriptions overlapping those of the embodiment of FIG. 5 will be omitted.

FIG. 11 illustrates the first driving pad PD1 disposed on the first surface FS on the upper side of the display device 10_1 and the light emitting elements LE of the pixel PX. Also, the second driving pad PD2 and the third driving pad PD3 disposed on the second surface BS under the display device 10_1 are shown.

The first driving pads PD1 may be disposed on an upper edge of the display device 10_1. When the data lines DL of the display device 10_1 are extended in the second direction DR2, the first driving pads PD1 may be disposed at upper and lower edges of the display device 10_1. Alternatively, when the data lines DL of the display device 10_1 are extended in the first direction DR1, the first driving pads PD1 may be disposed at left and right edges of the display device 10_1. In one or more embodiments, the data line DL is a line that applies a signal for driving the pixel PX, and the first driving pad PD1 is substantially the same as the data line DL but is not limited thereto. For example, the first driving pad PD1 may be substantially the same as another line applying a signal to the pixel PX or a power supply line applying a power voltage to the pixel PX.

Each of the first driving pads PD1 may be connected to a data fan-out line DFL through a first contact portion CNT1 penetrating the first interlayer insulating layer 141 and the second interlayer insulating layer 142. The data fan-out line DFL may be connected to the data line DL through the contact portion penetrating the first interlayer insulating layer 141 and the second interlayer insulating layer 142. Although it has been exemplified that the data fan-out line DFL is included in the first gate metal layer GTL1, embodiments of the present disclosure are not limited thereto. The data fan-out line DFL may be included in the second gate metal layer GTL2.

Also, each of the first driving pads PD1 may be connected to the side wiring SIL. The side wiring SIL may be disposed on the first surface FS, the first chamfered surface CS1, the first side surface SS1, the fifth chamfered surface CS5, and the second surface BS of the substrate 100. The side wiring SIL may be connected to the bottom connection line BCL on the lower surface of the substrate 100.

The first driving pads PD1 may be disposed on the second interlayer insulating layer 142. The first driving pads PD1 may be exposed without being covered by the first planarization layer 160, the second planarization layer 180, and the third planarization layer 190. An edge of the first driving pad PD1 may be covered by the first passivation layer PVX1. The first driving pad PD1 may have an exposed top surface that is not covered by the first passivation layer PXV1.

The first driving pad PD1 may include the first to fourth sub pads SPD1, SPD2, SPD3, and SPD4 and the transparent metal material TCO. The first sub pad SPD1 may be disposed on the second interlayer insulating layer 142. The second sub pad SPD2 may be disposed on the first sub pad SPD1 to cover the upper surface and side surfaces of the first sub pad SPD1. The third sub pad SPD3 may be disposed on the second sub pad SPD2 to cover the top surface and side surfaces of the second sub pad SPD2. The fourth sub pad SPD4 may be disposed on the third sub pad SPD3 to cover the top surface and side surfaces of the third sub pad SPD3. The transparent metal material TCO may be disposed on the fourth sub pad SPD4 to cover the upper surface and side surfaces of the fourth sub pad SPD4. Although it is exemplified that the first sub pad SPD1 is included in the first data metal layer DTL1, the second sub pad SPD2 is included in the second data metal layer DTL2, the third sub pad SPD3 is included in the third data metal layer DTL3, and the fourth sub pad SPD4 is included in the fourth data metal layer DTL4 but embodiments of the present disclosure are not limited thereto.

The first driving pad PD1 may include the flat portion PD1*a* and the partition wall portion PD1*b*. In the cross-sectional view, the first driving pad PD1 may have an L-shape, the flat portion PD1*a* may form a bottom surface of the first driving pad PD1, and the partition wall portion PD1*b* may be formed of the first driving pad PD1. The partition wall portion PD1*b* may be disposed between the flat portion PD1*a* and the first to third planarization layers 160, 180, and 190.

The maximum height of the upper surface of the flat portion PD1*a* of the first driving pad PD1 and the minimum height of the upper surface of the partition wall portion PD1*b* of the first driving pad PD1 may be different. For example, the height of the upper surface of the flat portion PD1*a* of the first driving pad PD1 may be lower than the height of the upper surface of the partition wall portion PD1*b*. The height difference between the upper surface of the flat portion PD1*a* and the upper surface of the partition wall portion PD1*b* may be equal to a first distance. For example, the first distance may be 1 μm to 3 μm.

In one or more embodiments, only the fourth sub pad SPD4 and the transparent metal material TCO may be disposed on the flat portion PD1*a*. The first to third sub pads SPD1, SPD2, and SPD3 are not disposed in the flat portion PD1*a* and the fourth sub pad SPD4 may not overlap the first to third sub pads SPD1, SPD2, and SPD3 in the flat portion PD1*a*. Because the flat portion PD1*a* is made of the fourth sub pad SPD4 and the transparent metal material TCO, there may be no step difference due to the plurality of data metal layers. Because the flat portion PD1*a* has a flat surface, the side wiring SIL may be stably adhered.

The first to fourth sub pads SPD1, SPD2, SPD3, and SPD4 and the transparent metal material TCO may be stacked on the partition wall portion PD1*b*. In the partition wall portion PD1*b*, the first to fourth sub pads SPD1, SPD2, SPD3, and SPD4 and the transparent metal material TCO may overlap in the thickness direction of the substrate 100. Because a plurality of data metal layers, for example, the first data metal layer DTL1, the second data metal layer DTL2, the third data metal layer DTL3, and the fourth data metal layer DTL4 are disposed in the partition wall portion PD1*b*, there may be a step difference due to the plurality of data metal layers. Referring to FIG. 12, there may be the step difference due to one end of the first sub pad SPD1, one end of the second sub pad SPD2, one end of the third sub pad SPD3, the first to third sub pads SPD1, SPD2, and SPD3, and the fourth sub pad SPD4 covering a part of the upper surface and the side surface of the first to third sub pads SPD1, SPD2, and SPD3 in the partition wall portion PD1*b*.

The fourth sub pad SPD4 may be formed of the same material and the same layer as the anode pad electrode APD and the cathode pad electrode CPD. The fourth sub pad SPD4 does not overlap the first to third sub pads SPD1, SPD2, and SPD3 in the flat portion PD1*a*, and may overlap the first to third sub pads SPD1, SPD2, and SPD3 in the partition wall portion PD1*b*.

The second driving pad PD2 may be disposed at one end of the bottom connection line BCL, and the third driving pad PD3 may be disposed at the other end of the bottom connection line BCL. The second driving pad PD2 and the third driving pad PD3 may be formed of the transparent conductive oxide such as indium tin oxide (ITO) and indium zinc oxide (IZO).

A fourth planarization layer 170 may be disposed on the bottom connection line BCL and the bottom surface of the substrate 100. The fourth planarization film 170 is formed of the organic film such as acrylic resin, epoxy resin, phenolic resin, polyamide resin, polyimide resin, etc.

A second passivation layer PVX2 may be disposed on the fourth planarization layer 170. The second passivation layer PVX2 may be formed of the inorganic layer, for example, the silicon nitride layer, the silicon oxynitride layer, the silicon oxide layer, the titanium oxide layer, or the aluminum oxide layer.

The side wiring SIL may be disposed on the first surface FS, the second surface BS, the first side surface SS1, the first chamfered surface CS1, and the fifth chamfered surface CS5 of the substrate 100. The side wiring SIL may be disposed on the first driving pad PD1 disposed on the edge of the first surface FS of the substrate 100 to be connected to the first driving pad PD1. The side wiring SIL may be disposed on the second driving pad PD2 disposed on the edge of the second surface BS of the substrate 100 to be connected to the second driving pad PD2. The side wiring SIL may contact the first chamfered surface CS1, the first side SS1, and the fifth chamfered surface CS5 of the substrate 100.

An overcoat layer OC may be disposed on the first surface FS, the first chamfered surface CS1, the first side surface SS1, the fifth chamfered surface CS5, and the second surface BS of the substrate 100. The overcoat layer OC may be disposed to cover the side wiring SIL. The overcoat layer OC may be formed of the organic film such as acryl resin, epoxy resin, phenolic resin, polyamide resin, polyimide resin, etc.

A circuit board 200 may be disposed on the bottom surface of the substrate 100. The circuit board 200 may be connected to the exposed third driving pad PD3 without being covered by the fourth planarization layer 170 and the second passivation layer PVX2 using the conductive adhesive member CAM. The circuit board 200 may be connected to the third driving pad PD3 through the conductive adhesive member CAM. The conductive adhesive member CAM may be an anisotropic conductive film or an anisotropic conductive paste.

FIG. 13 is an example of a cross-sectional structure of the first driving pad taken along the line C-C' of FIG. 9A. In FIG. 13, a bottom wiring BL applying a signal or a power voltage to the pixel PX and a first contact portion CNT1 connecting the bottom wiring BL are additionally illustrated.

The bottom wiring BL may overlap the first driving pad PD1. Although the bottom wiring BL is illustrated as being included in the second gate metal layer GTL2, embodiments of the present disclosure are not limited thereto. The bottom wiring BL may be a line that applies signals for driving the pixel PX or a power voltage. The first contact portion CNT1 may penetrate the second interlayer insulating layer 142 to expose the bottom wiring BL. The bottom wiring BL may be connected to the first sub pad SPD1 of the first driving pad PD1 through the first contact portion CNT1.

In the display device 10_1 according to the embodiment of FIG. 13, the side wiring SIL may be printed to be around (e.g., to surround) the flat portion PD1*a* having no step difference and may be disposed beyond the partition wall portion PD1*b*. Accordingly, when the side wiring SIL made of silver (Ag) is printed to be around (e.g., to surround) the first driving pad PD1, it is possible to prevent the shape of the side wiring SIL from being deformed or the length of the side wiring SIL from being changed.

Figure 14:
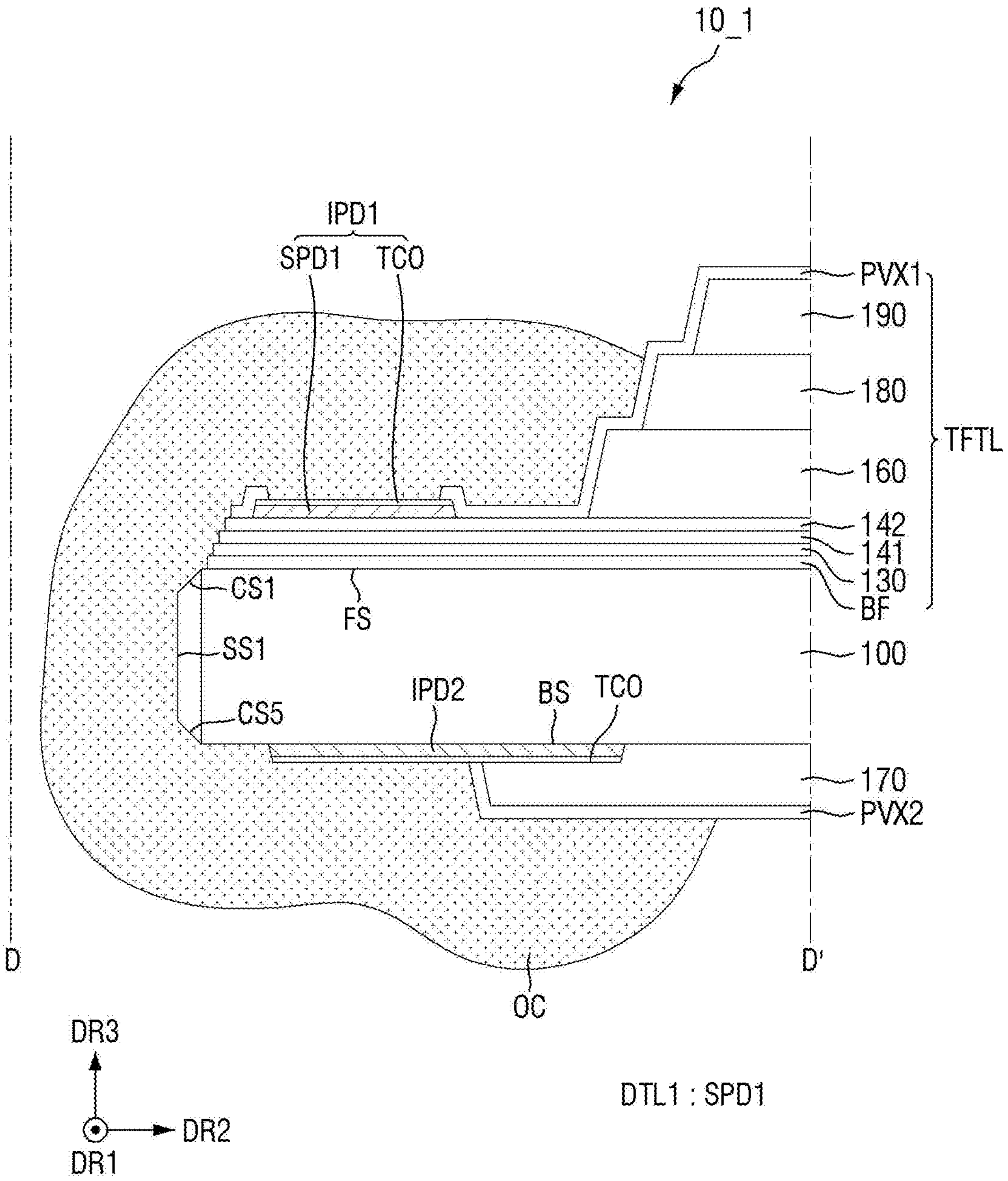
FIG. 14 is an example of a cross-sectional structure of the first inspection pad taken along the line D-D' of FIG. 9A.

FIG. 14 is an example of a cross-sectional structure of the first inspection pad taken along the line D-D' of FIG. 9A. FIG. 14 illustrates the first inspection pad IPD1 and a second inspection pad IPD2.

The first inspection pad IPD1 may include the first sub pad SPD1 and the transparent metal material TCO.

The first sub pad SPD1 may be disposed on the second interlayer insulating layer 142. The first sub pad SPD1 may be exposed without being covered by the first planarization layer 160, the second planarization layer 180, and the third planarization layer 190. The edge of the first sub pad SPD1 may be covered by the first passivation layer PVX1. The first sub pad SPD1 may have an exposed top surface that is not covered by the first passivation layer PXV1.

The first sub pad SPD1 may be included in the first data metal layer DTL1. The transparent metal material TCO may be disposed on the first sub pad SPD1.

The second inspection pad IPD2 is disposed on the second surface BS of the substrate 100 and may include the same layer as the bottom connection line BCL and an electrode layer made of the same material. The second test pad IPD2 may include the transparent conductive oxide such as indium tin oxide (ITO) and indium zinc oxide (IZO) disposed on the electrode side.

Figure 15:
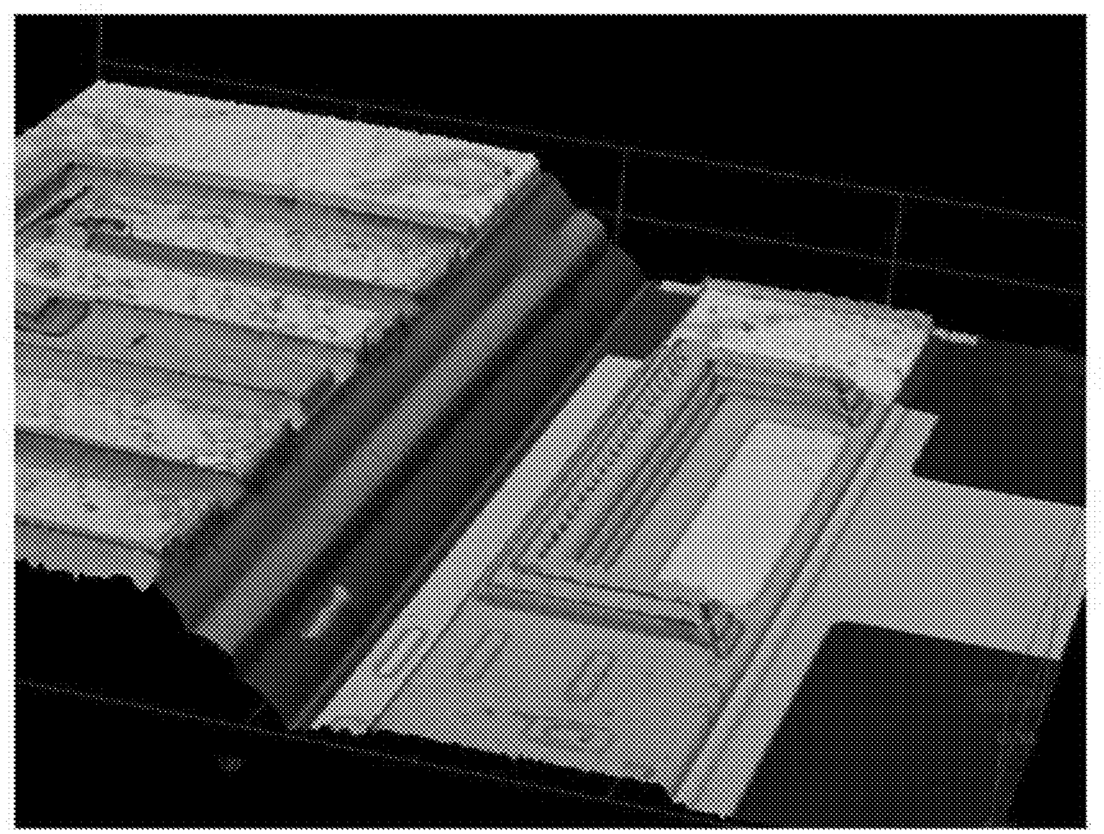
FIG. 15 is an image showing a confocal microscope image of a first driving pad.

FIG. 15 is an image showing a confocal microscope image of a first driving pad.

Referring to FIG. 15, the shape of the first driving pad PD1 may be determined by analyzing a confocal microscope image. A part of the first driving pad PD1 in contact with the side wiring SIL may be flat, and a part facing toward the pixel PX may have a wall structure.

Hereinafter, a display device 10_2 according to one or more embodiments will be described.

Figure 16A:
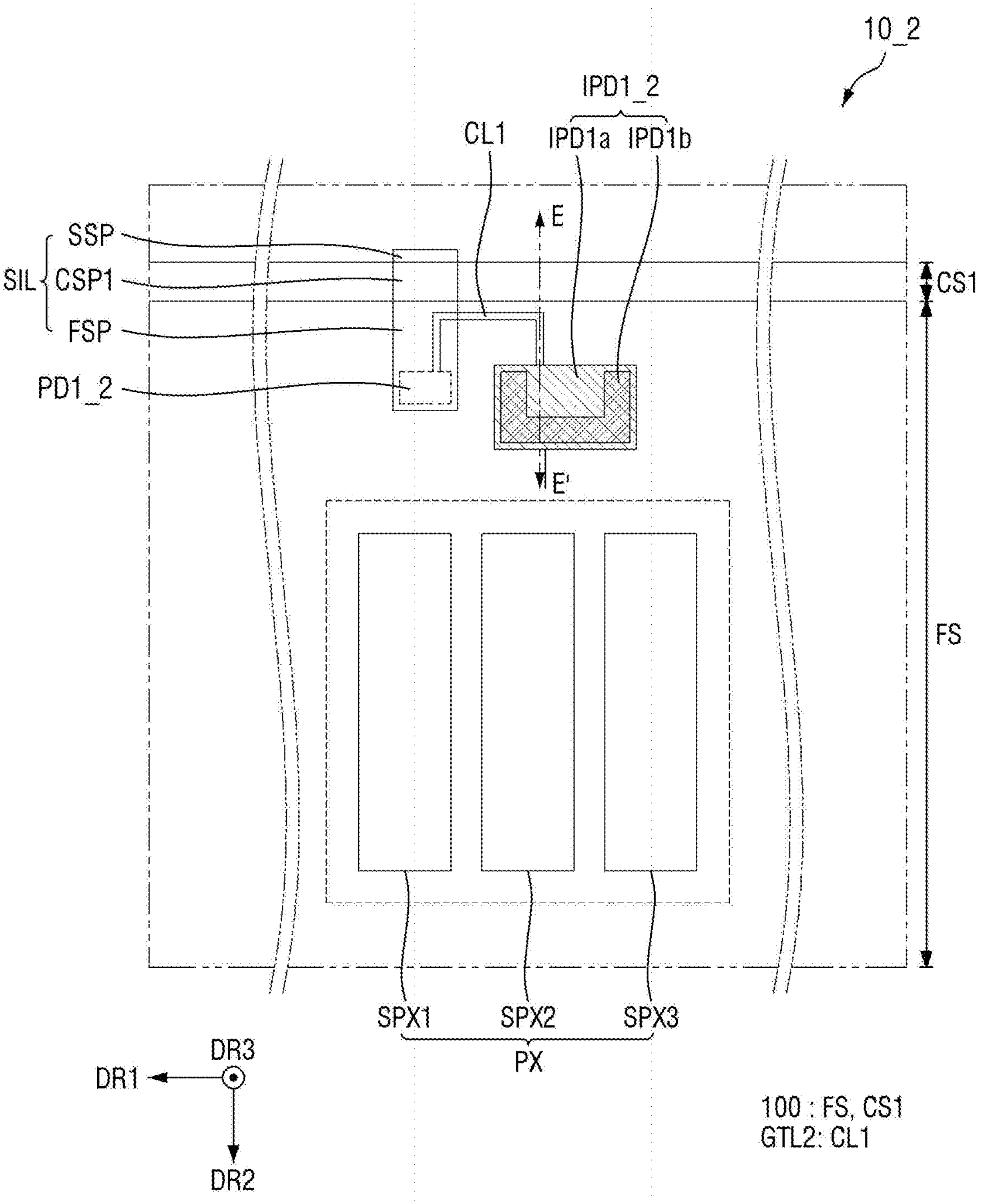
FIGS. 16A to 16C are plan views illustrating one side edge of a display device according to one or more embodiments.
Figure 16B:
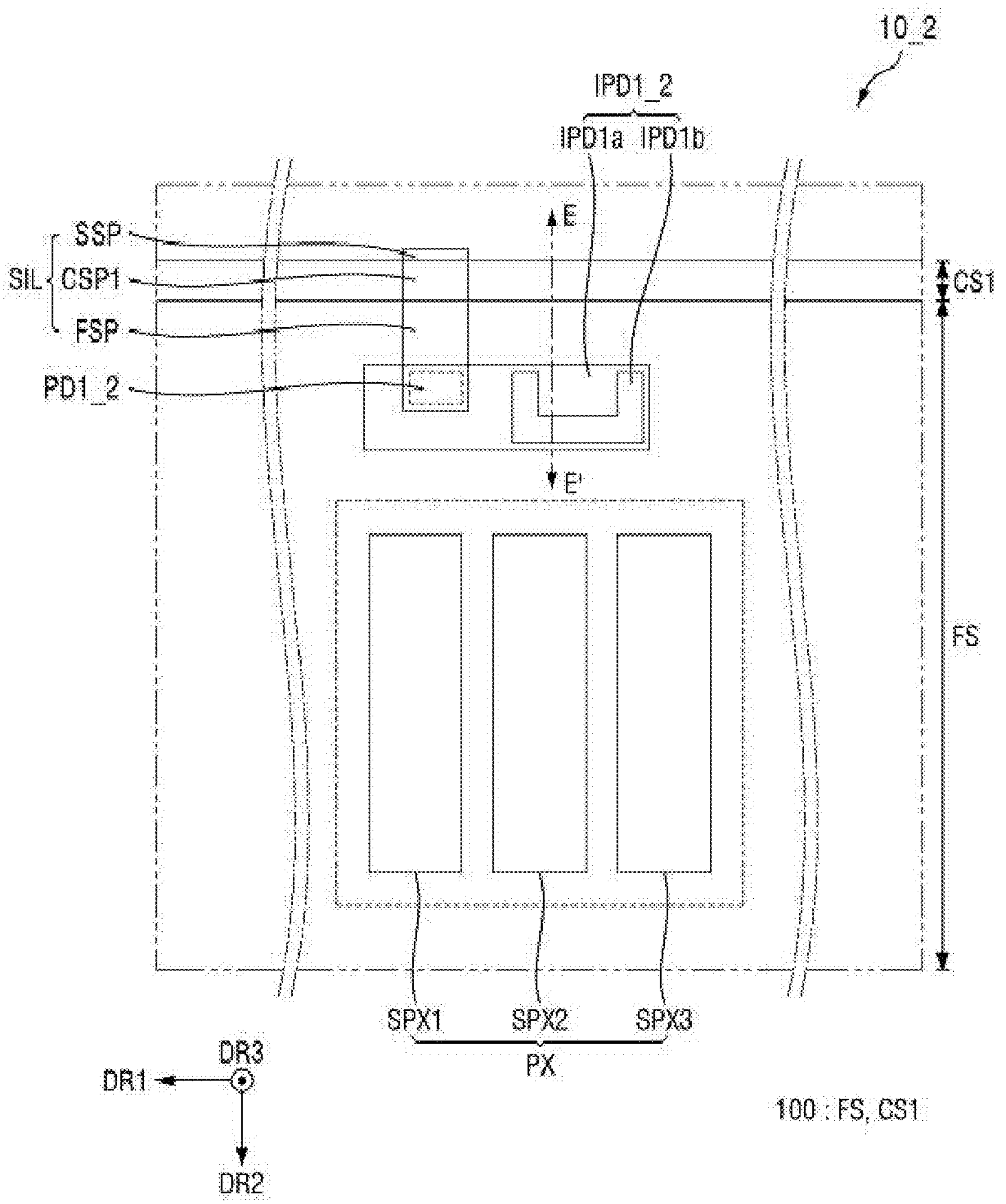
Figure 16C:
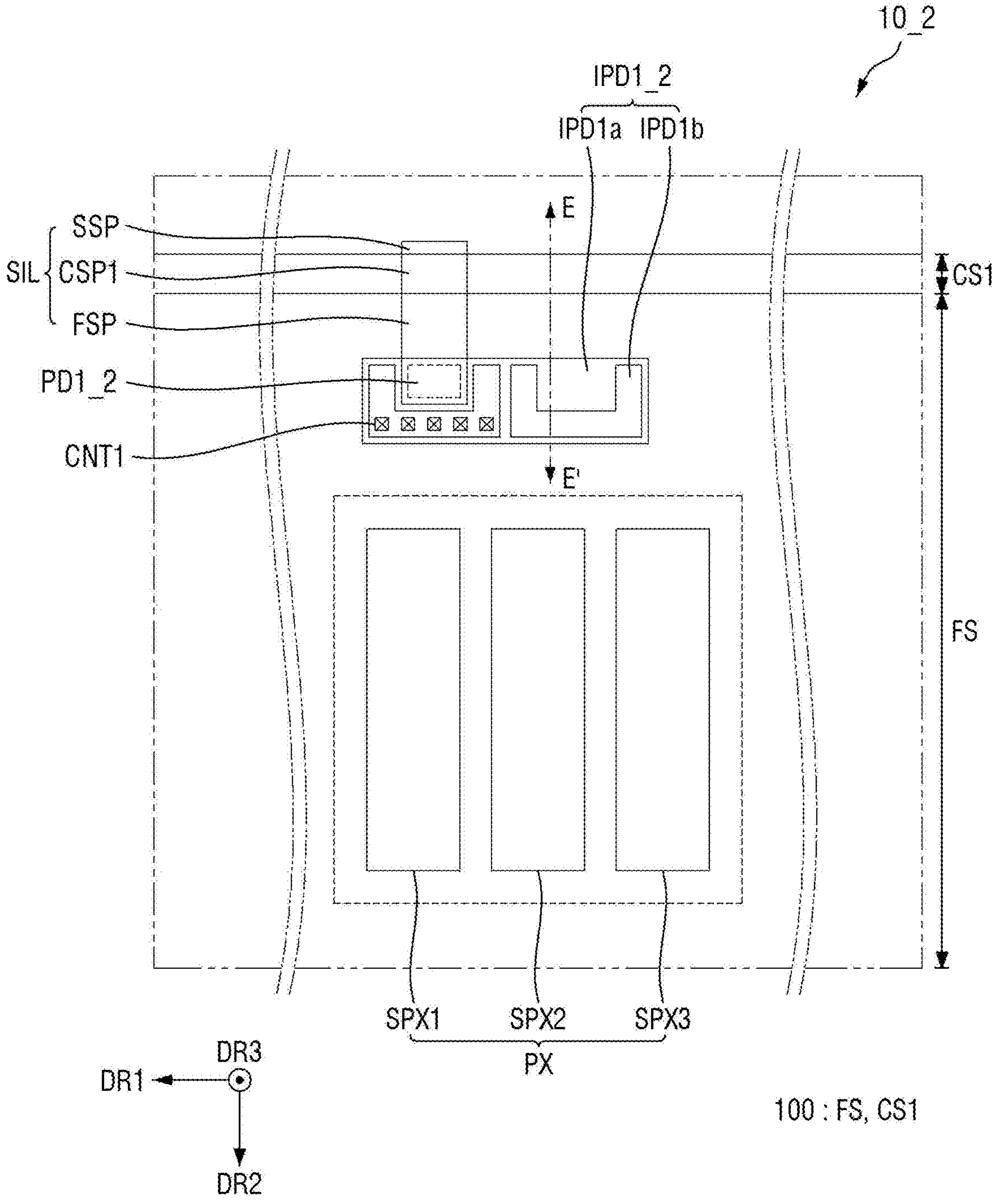
Figure 17:
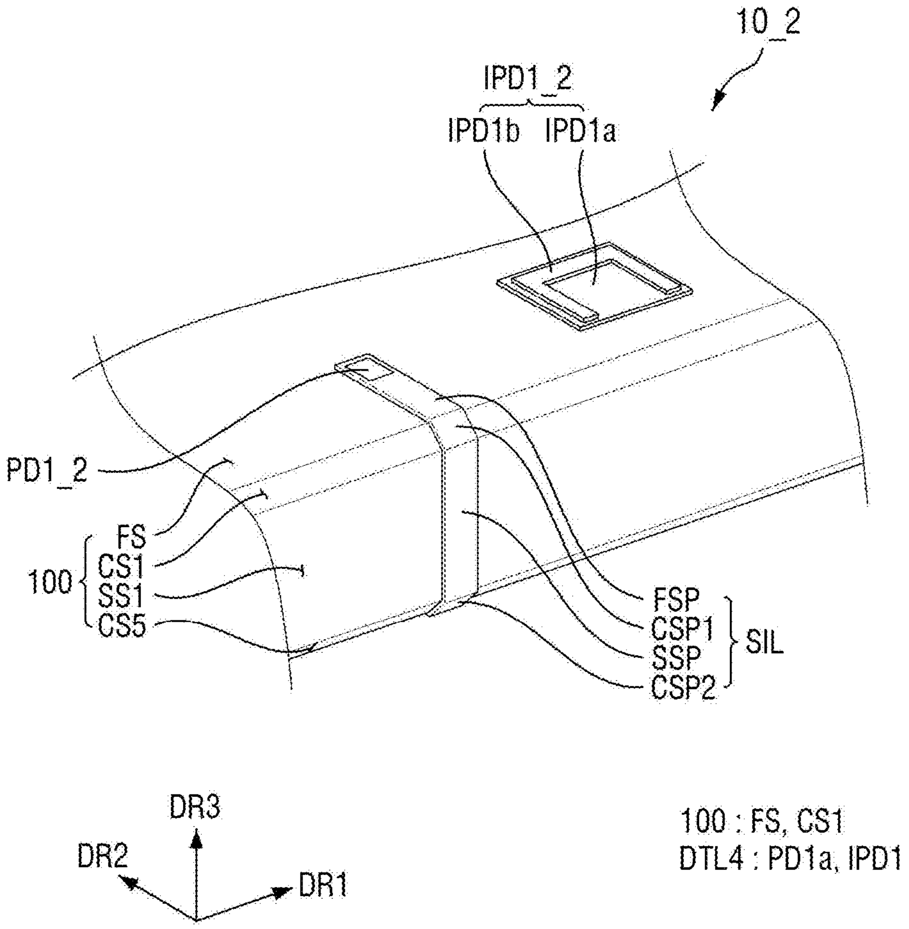
FIG. 17 is a perspective view illustrating one edge of a display device according to one or more embodiments.

FIGS. 16A to 16C are plan views illustrating one side edge of a display device according to one or more embodiments. FIG. 17 is a perspective view illustrating one edge of a display device according to one or more embodiments.

Referring to FIGS. 16A-16C and 17, the display device 10_2 according to the embodiment of FIGS. 16A-16C and 17 may include a first driving pad PD1_2, the side wiring SIL, a first inspection pad IPD1_2, and a first connection line CL1 (e.g., see FIG. 18) disposed on the lower edge of the first surface FS.

The first driving pad PD1_2 may have a stacked structure in which the first to fourth sub pads (SPD1, SPD2, SPD3, and SPD4 of FIG. 11) are stacked. However, embodiments are not limited thereto, and the first driving pad PD1_2 may have the wall structure including the flat portion and a partition wall portion as in the embodiment of FIG. 11.

The first inspection pad IPD1_2 is different from the first inspection pad (IPD1 of FIG. 11) of the display device (10_1 of FIG. 11) formed of a single data metal layer in that the first inspection pad IPD1_2 includes the flat portion IPD1*a* and a partition wall portion IPD1*b* around (e.g., surrounding) three side surfaces of the flat portion IPD1*a*. The partition wall portion IPD1*b* may have the wall structure around (e.g., surrounding) three side surfaces of the flat portion IPD1*a*. The partition wall portion IPD1*b* may be disposed between the pixel PX and the flat portion IPD1*a*.

The flat portion IPD1*a* may form a bottom surface of the first driving pad PD1. The flat portion IPD1*a* may have one surface parallel to the first surface FS of the substrate 100, that is, a flat surface. The flat portion IPD1*a* may be formed of the fourth data metal layer DTL4 and may not have the step difference by including a single data metal layer. Also, because the flat portion IPD1*a* does not include the contact portion connected to the lower line, it may have the flat surface without the step difference. The flat portion IPD1*a* may have the rectangular shape in which the length in the first direction DR1 is longer than the length in the second direction DR2 but is not limited thereto.

The partition wall portion IPD1*b* may be formed to be around (e.g., surround) three side surfaces of the flat portion IPD1*a*. The partition wall portion IPD1*b* may serve as the partition wall or the wall preventing an inspection probe 400 from proceeding toward the upper side (e.g., one side of the second direction DR2) of the display device 10 on which the pixels PX are disposed even if the inspection probe 400 in FIG. 20 touches the first inspection pad PD1_2.

The partition wall portion IPD1*b* may be connected to the first portion extending in the first direction DR1 and one end of the first portion, may be connected to the second portion extending in the second direction DR2 and the other end of the first portion, and may be connected to the third portion extending in the second direction DR2. The first portion, the second portion, and the third portion of the partition wall portion IPD1*b* may be formed to be around (e.g., surround) three side surfaces of the flat portion IPD1*a*.

The partition wall portion IPD1*b* of the first inspection pad IPD1_2 may be thicker than the flat portion IPD1*a*. Because the partition wall portion IPD1*b* includes the plurality of data metal layers and the flat portion IPD1*a* includes a single data metal layer, the upper surface of the partition wall portion IPD1*b* may be higher than the top surface of the flat portion IPD1*a*.

The first inspection pad IPD1_2 may be connected to the first driving pad PD1_2 through the first connection line CL1.

Referring to FIG. 16B, the display device 10_2 according to the present embodiment may include the first driving pad PD1_2, the side wiring SIL, and the first inspection pad IPD1_2 disposed on the lower edge of the first surface FS. The embodiment of FIG. 16B is different from the embodiment of FIG. 16A in that the first connection line CL1 is deleted and the first driving pad PD1_2 and the first inspection pad IPD1_2 are integrally formed. That is, in FIG. 16B, the first driving pad PD1_2 and the first inspection pad IPD1_2 may share the transparent metal material TCO with the first sub pad SPD1 as shown in FIGS. 9A to 9F.

Referring to FIG. 16C, the display device 10_2 according to the present embodiment may include the first driving pad PD1_2, the side wiring SIL, and the first inspection pad IPD1_2 disposed on the lower edge of the first surface FS. The embodiment of FIG. 16C is different from the embodiment of FIG. 16A in that the first connection line CL1 is deleted, the first driving pad PD1_2 and the first inspection pad IPD1_2 are integrally formed, and the first driving pad PD1_2 includes the flat portion PD1*a* and the partition wall portion PD1*b*. That is, in FIG. 16C, both the first driving pad PD1_2 and the first inspection pad IPD1_2 may have the wall structure.

Figure 18:
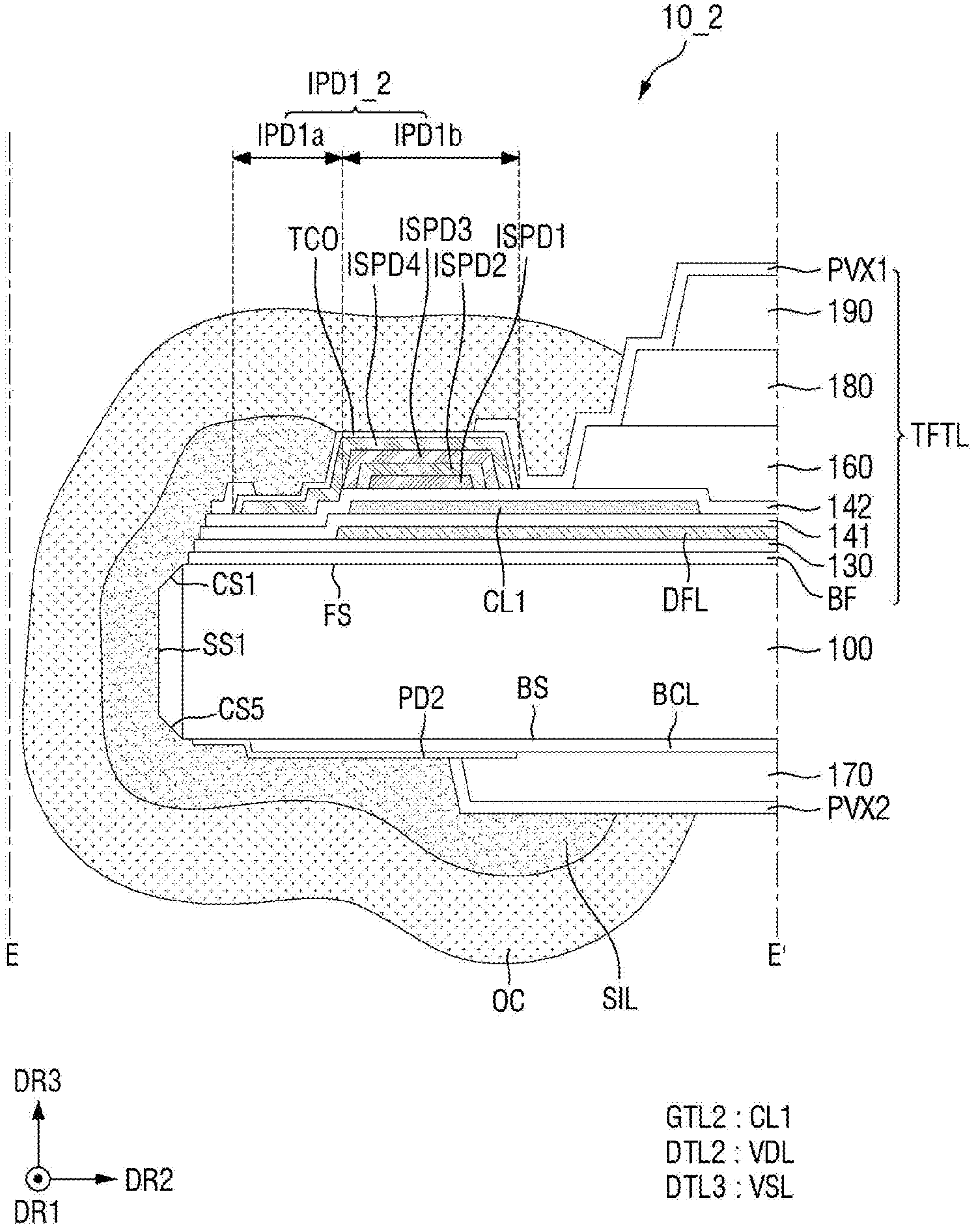
FIG. 18 is an example of a cross-sectional structure of a pixel taken along the line E-E' of FIG. 16A.

FIG. 18 is an example of a cross-sectional structure of a pixel taken along the line E-E' of FIG. 16A. In FIG. 18, the first inspection pad IPD1_2 disposed on the first surface FS, which is the upper side of the display device 10_2, and the second inspection pad, IPD1_2, which is disposed on the second surface BS, which is the lower side of the display device 10_2 are shown.

The first inspection pad IPD1_2 may be disposed on the upper edge of the display device 10_2. The first inspection pad IPD1_2 may be disposed on the second interlayer insulating layer 142. The first inspection pads IPD1_2 may be exposed without being covered by the first planarization layer 160, the second planarization layer 180, and the third planarization layer 190. The edge of the first inspection pad IPD1_2 may be covered by the first passivation layer PVX1. The first inspection pad IPD1_2 may have the exposed top surface that is not covered by the first passivation layer PXV1.

The first inspection pad IPD1_2 may include the first to fourth sub pads ISPD1 to ISPD4 and the transparent metal material TCO. The first sub pad ISPD1 may be disposed on the second interlayer insulating layer 142. The second sub pad ISPD2 may be disposed on the first sub pad ISPD1 to cover the upper surface and side surfaces of the first sub pad ISPD1. The third sub pad ISPD3 may be disposed on the second sub pad ISPD2 to cover the top surface and side surfaces of the second sub pad ISPD2. The fourth sub pad ISPD4 may be disposed on the third sub pad ISPD3 to cover the top surface and side surfaces of the third sub pad ISPD3. The transparent metal material TCO may be disposed on the fourth sub pad ISPD4 to cover the upper surface and side surfaces of the fourth sub pad ISPD4. Although in one or more embodiments, the first sub pad ISPD1 may include the first data metal layer DTL1, the second sub pad ISPD2 may include the second data metal layer DTL2, the third sub pad ISPD3 may include the third data metal layer DTL3, and the fourth sub pad ISPD4 may include the fourth data metal layer DTL4 but embodiments of the present disclosure are not limited thereto.

The first inspection pad IPD1_2 may include the flat portion IPD1*a* and the partition wall portion IPD1*b*. In the cross-sectional view, the first inspection pad IPD1_2 may have the L-shape, the flat portion IPD1*a* may form the bottom surface of the first inspection pad IPD1_2, and the partition wall portion IPD1*b* may form a partition wall of the first inspection pad IPD1_2. The partition wall portion IPD1*b* may be disposed between the flat portion IPD1*a* and the first to third planarization layers 160, 180, and 190.

The maximum height and the minimum height of the upper surface of the first inspection pad IPD1_2 may be different. For example, the height of the upper surface of the flat portion IPD1*a* of the first inspection pad IPD1_2 may be lower than the height of the upper surface of the partition wall portion IPD1*b*. The height difference between the upper surface of the flat portion IPD1*a* and the upper surface of the partition wall portion IPD1*b* may be 1 μm to 3 μm but is not limited thereto.

In the embodiment of FIG. 18, only the fourth sub pad ISPD4 and the transparent metal material TCO may be disposed on the flat portion IPD1*a*. The first to third sub pads ISPD1, ISPD2, and ISPD3 are not disposed on the flat portion IPD1*a*, and the fourth sub pad ISPD4 may not overlap the first to third sub pads ISPD1, ISPD2, and ISPD3 in the flat portion IPD1*a*. Because the flat portion IPD1*a* is made of the fourth sub pad ISPD4 and the transparent metal material TCO, there may be no step difference due to the plurality of data metal layers.

The first to fourth sub pads ISPD1 to ISPD4 and the transparent metal material TCO may be stacked on the partition wall portion IPD1*b*. The first to fourth sub pads ISPD1 to ISPD4 and the transparent metal material TCO may overlap in the thickness direction of the substrate 100 in the partition wall portion IPD1*b*. Because the plurality of sub pads ISPD1 to ISPD4 are disposed in the partition wall portion IPD1*b*, the step difference may exist due to the plurality of sub pads ISPD1 to ISPD4.

The second inspection pad IPD2 is disposed on the second surface BS of the substrate 100 and may be formed of the transparent conductive oxide such as indium tin oxide (ITO) and indium zinc oxide (IZO).

FIG. 18 shows a plurality of power supply lines. The plurality of power supply lines may be lines that apply a power voltage for driving the pixel PX. A first power supply line may be included in the second data metal layer DTL2. The first power supply line may be disposed on the first planarization layer 160. The first power supply line may be a line that applies a high potential voltage to the pixel PX. A second power supply line may be disposed on the second planarization layer 180. The second power supply line may be a line that applies a low potential voltage to the pixel PX.

Hereinafter, a side wiring inspection process using the first inspection pad IPD1_2 will be described with reference to FIGS. 19 and 20.

Figure 19:
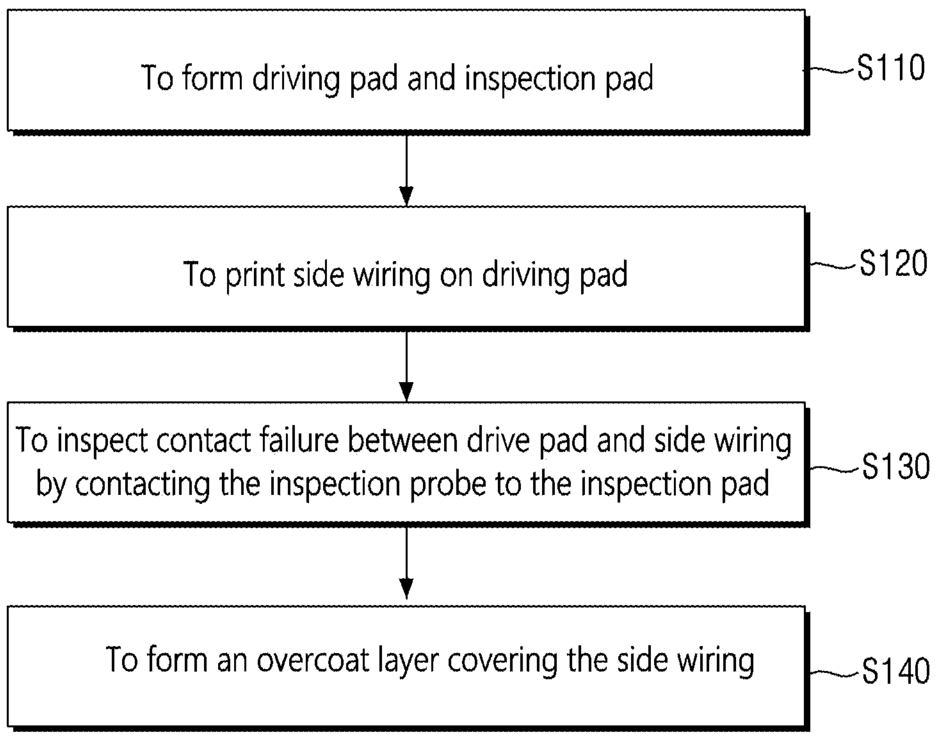
FIG. 19 is a flowchart illustrating a method of side wiring inspection using an inspection pad according to one or more embodiments.

FIG. 19 is a flowchart illustrating a method of side wiring inspection using an inspection pad according to one or more embodiments. FIG. 20 is a conceptual diagram of a side wiring inspection method using an inspection pad.

First, the first driving pad PD1_2, the second driving pad PD2, the first inspection pad IPD1_2, and the second inspection pad IPD2 are formed on the substrate 100 (S110).

Then, the side wiring SIL connecting the first driving pad PD1_2 and the second driving pad PD2 is printed (S120). The side wiring SIL may be formed by sintering using a laser after printing a metal paste including metal particles, a monomer, and a solvent on the substrate 100 using a silicon pad. The side wiring SIL may be formed in a way that wraps around the front surface part FSP, the first inclined part CSP1, the side part SSP, the second inclined part CSP2, and the back part BSP.

Next, a contact failure between the first driving pad PD1_2 and the side wiring SIL and a contact failure between the second driving pad PD2 and the side wiring SIL are inspected by bringing the inspection probe 400 into contact with the first inspection pad IPD1_2 and the second inspection pad IPD2 (S130).

Figure 20:
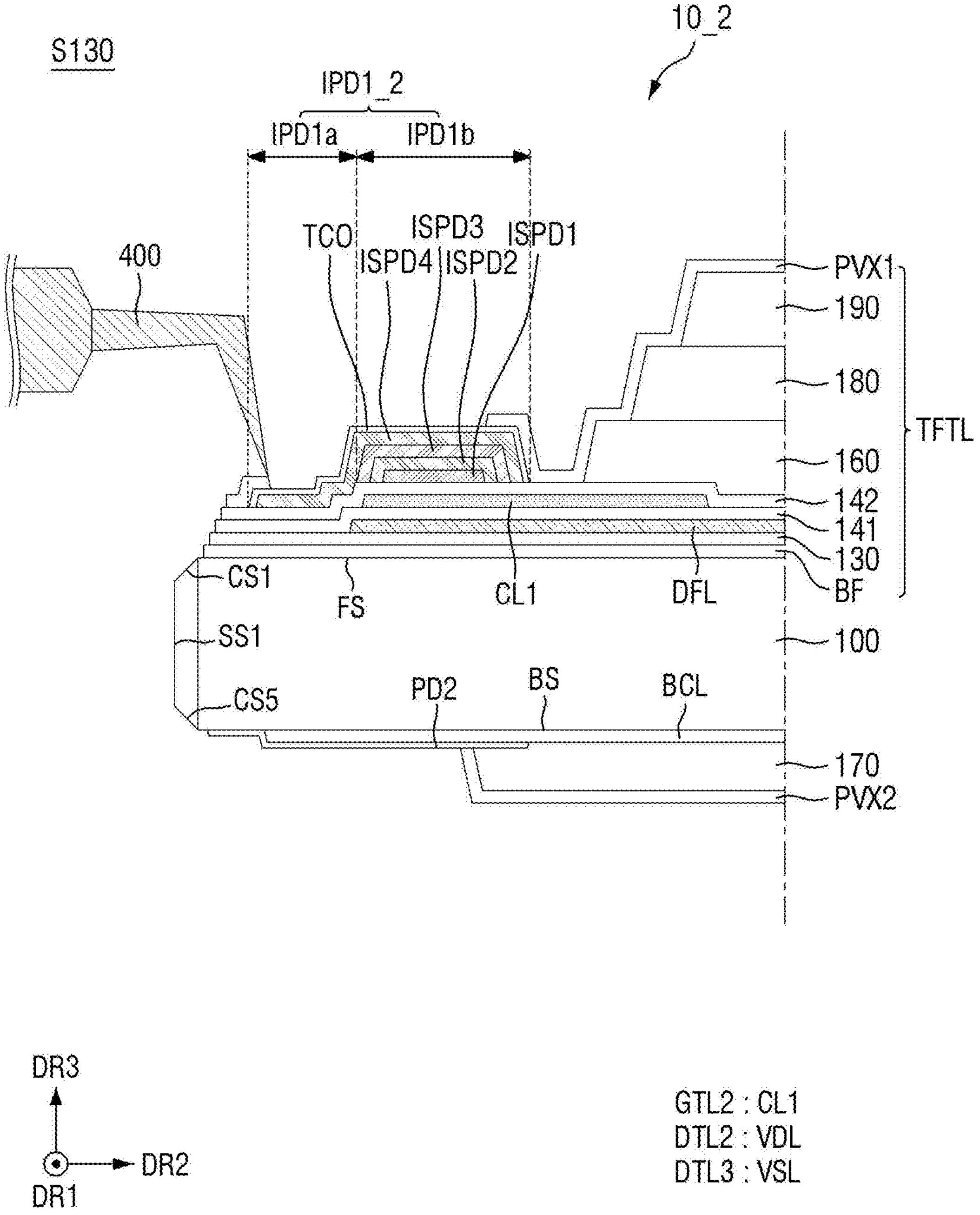
FIG. 20 is a conceptual diagram of a side wiring inspection method using an inspection pad.

Referring to FIGS. 17 and 20, after contacting the inspection probe 400 (or pogo pin) is attached to the first inspection pad IPD1_2 connected to the first driving pad PD1_2 and the second test pad IPD2 connected to the second driving pad PD2, it may be checked whether the side wiring SIL is shorted or opened by measuring the resistance.

In this case, the inspection probe 400 may cross the inspection pad and enter the first to third planarization layers 160, 180, and 190 when the inspection pad is formed flat while the inspection probe 400 rubs the inspection pad. For example, when the inspection probe 400 enters the inside of the second planarization layer 180 while being pushed on the inspection pad, a short between the first power supply line and the second power supply line may occur.

According to the embodiment of FIGS. 19-20, the first inspection pad IPD1_2 may have the height difference between the upper surfaces of the first inspection pad IPD1_2 through the flat portion IPD1*a* and the partition wall portion IPD1*b*. Because the first inspection pad IPD1_2 has a higher top surface of the partition wall portion IPD1*b* close to the center of the substrate 100 than the top surface of the flat portion IPD1*a* located at the edge of the substrate 100, the inspection probe 400 may not pass through the partition wall portion IPD1*b* even if the inspection probe 400 is pushed on the first inspection pad IPD1_2. As the bezel area of the display device 10_2 is reduced or minimized, the lengths of the first inspection pad IPD1_2 and the second inspection pad IPD2 in the second direction DR2 may be reduced. The inspection probe 400 may be caught by the partition wall portion IPD1*b* of the first inspection pad IPD1_2 and may not proceed toward the first to third planarization layers 160, 180, and 190 even if the lengths of the first test pad IPD1_2 and the second test pad IPD2 in the second direction DR2 are reduced. Accordingly, the short between the first power supply line and the second power supply line may be prevented from occurring as the inspection probe 400 enters the interior of the second planarization layer 180 while being pushed on the inspection pad.

Figure 21:
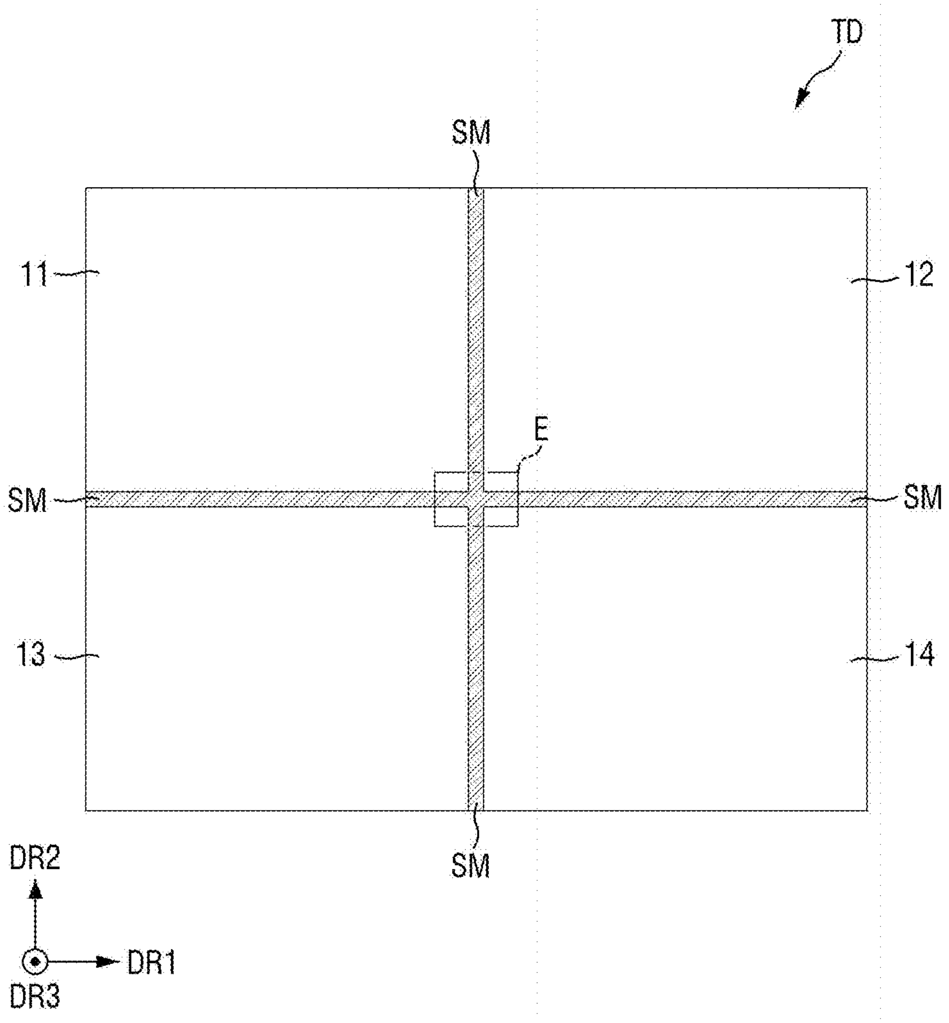
FIG. 21 is a perspective view illustrating a tiled display device including a plurality of display devices according to one or more embodiments.

FIG. 21 is a perspective view illustrating a tiled display device including a plurality of display devices according to one or more embodiments.

Referring to FIG. 21, a tiled display device TD may include a plurality of display devices 11, 12, 13, and 14, and a connection member SM. For example, the tiled display device TD may include a first display device 11, a second display device 12, a third display device 13, and a fourth display device 14.

The plurality of display devices 11, 12, 13, and 14 may be arranged in a matrix form in M (M is a positive integer) number of rows and N (N is a positive integer) number of columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TD are not limited to those illustrated in FIG. 25. The number and arrangement of the display devices 11, 12, 13, and 14 in the tiled display device TD may be determined in response to the size of the display device 10 and the tiled display device TD, and the shape of the tiled display device TD.

The plurality of display devices 11, 12, 13, and 14 may have the same size as each other, but embodiments of the present disclosure are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be disposed such that the long sides or the short sides thereof are connected to each other. Some or all of the plurality of display devices 11, 12, 13, and 14 may be disposed at the edge of the tiled display device TD, and may be disposed one side of the tiled display device TD. At least one of the plurality of display devices 11, 12, 13, and 14 may be disposed at least one corner of the tiled display device TD, and may be formed two adjacent sides of the tiled display device TD. At least one of the plurality of display devices 11, 12, 13, and 14 may be around (e.g., surrounded by) other display devices.

Each of the plurality of display devices 11, 12, 13, and 14 may be substantially the same as the display device 10 described with reference to FIG. 1. Therefore, a description of each of the plurality of display devices 11, 12, 13, and 14 will be omitted.

The connection member SM may include a coupling member or an adhesive member. In this case, the plurality of display devices 11, 12, 13, and 14 may be connected to each other by the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 22:
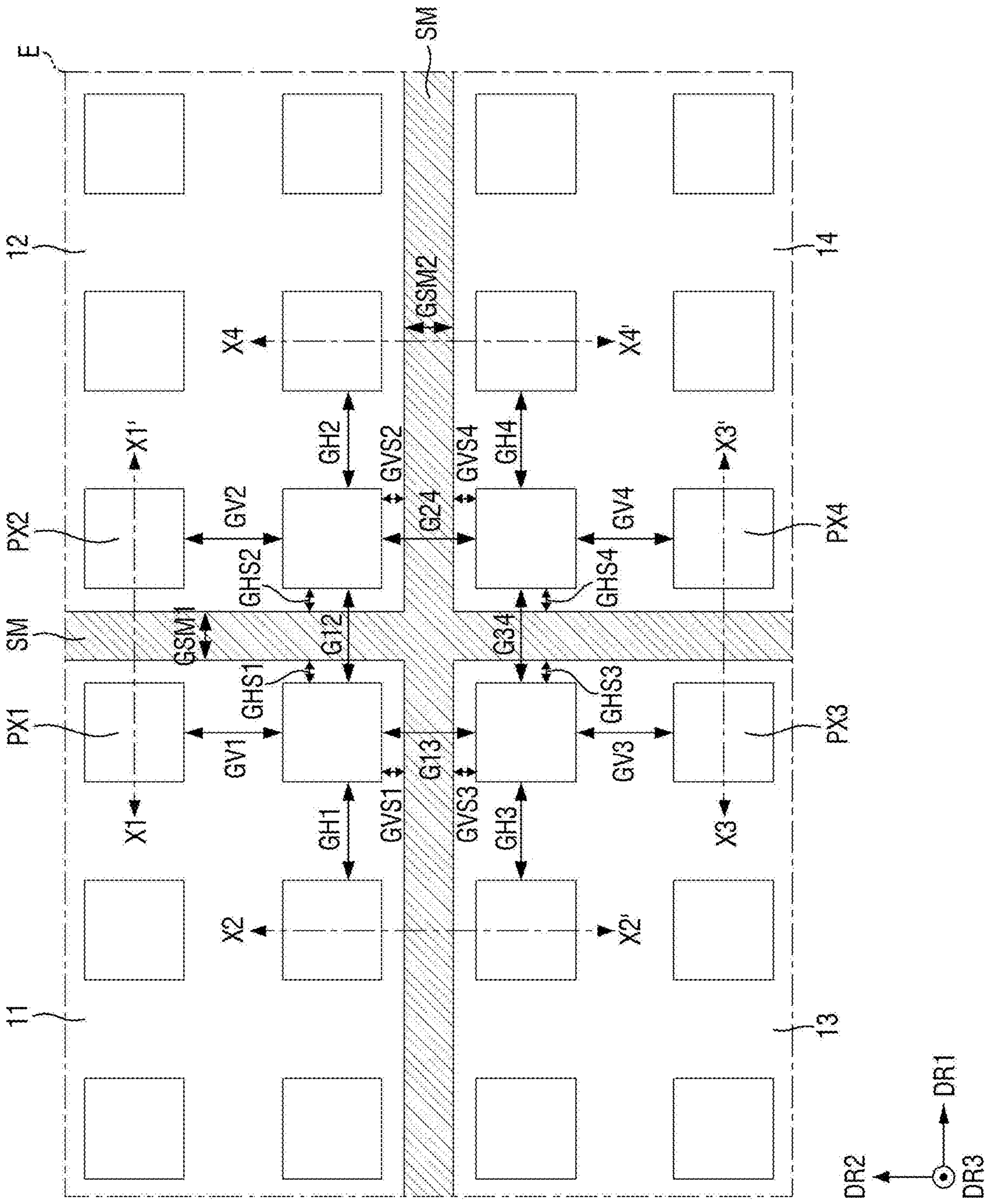
FIG. 22 is an enlarged view of an area E of FIG. 21.

FIG. 22 is an enlarged view of an area E of FIG. 21.

Referring to FIG. 22, the connection member SM may have a planar shape of a cross, or a plus sign in a central area of the device TD in which the first display device 11, the second display device 12, the third display device 13, and the fourth display device 14 are adjacent to each other. The connection member SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form along the first direction DR1 and the second direction DR2 to display an image. The second display device 12 may include second pixels PX2 arranged in a matrix along the first direction DR1 and the second direction DR2 to display an image. The third display device 13 may include third pixels PX3 arranged in a matrix along the first direction DR1 and the second direction DR2 to display an image. The fourth display device 14 may include fourth pixels PX4 arranged in a matrix along the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The connection member SM may be disposed between the first pixel PX1 and the second pixel PX2 adjacent in the first direction DR1. A minimum distance G12 between the first pixels PX1 and the second pixels PX2 adjacent in the first direction DR1 may be the sum of the minimum distance GHS1 between the first pixel PX1 and the connection member SM in the first direction DR1, the minimum distance GHS2 between the second pixel PX2 and the connection member SM in the first direction DR1 and a width GSM1 of the connection member SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the connection member SM in the first direction DR1 may be smaller than the first horizontal separation distance GH1, and the minimum distance GHS2 between the second pixel PX2 and the connection member SM in the first direction DR1 may be smaller than the second horizontal separation distance GH2. Further, the width GSM1 of the connection member SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The connection member SM may be disposed between the third pixel PX3 and the fourth pixel PX4 adjacent in the first direction DR1. A minimum distance G34 between the third pixel PX3 and the fourth pixel PX4 adjacent in the first direction DR1 may be the sum of a minimum distance GHS3 between the third pixel PX3 and the connection member SM in the first direction DR1, a minimum distance GHS4 between the fourth pixel PX4 and the connection member SM in the second direction DR1, and the width GSM1 of the connection member SM in the second direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the seam SM in the first direction DR1 may be smaller than the third horizontal separation distance GH3, and the minimum distance GHS4 between the fourth pixel PX4 and the connection member SM in the first direction DR1 may be smaller than the fourth horizontal separation distance GH4. Further, in the first direction DR1, the width GSM1 of the connection member SM may be smaller than the third horizontal separation distance GH3 or the fourth horizontal separation distance GH4.

The minimum distance between the first pixels PX1 adjacent in the second direction DR2 may be defined as a first vertical separation distance GV1, and the minimum distance between the third pixels PX3 adjacent in the first direction DR2 may be defined as a third vertical separation distance GV3. The first vertical separation distance GV1 and the third vertical separation distance GV3 may be substantially the same.

The connection member SM may be disposed between the first pixel PX1 and the third pixel PX3 adjacent in the first direction DR2. A minimum distance G13 between the first pixel PX1 and the third pixel PX3 adjacent in the first direction DR2 may be the sum of a minimum distance GVS1 between the first pixel PX1 and the connection member SM in the second direction DR2, a minimum distance GVS3 between the third pixel PX3 and the connection member SM in the second direction DR2, and a width GSM2 of the connection member SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the connection member SM in the second direction DR2 may be smaller than the first vertical separation distance GV1, and the minimum distance GVS3 between the third pixel PX3 and the connection member SM in the second direction DR2 may be smaller than the third vertical separation distance GV3. Further, in the second direction DR2, the width GSM2 of the connection member SM may be smaller than the first vertical separation distance GV1 or the third vertical separation distance GV3.

The minimum distance between the adjacent second pixels PX2 in the second direction DR2 may be defined as a second vertical separation distance GV2, and the minimum distance between the fourth pixels PX4 adjacent in the second direction DR2 may be defined as a fourth vertical separation distance GV4. The second vertical separation distance GV2 and the fourth vertical separation distance GV4 may be substantially the same.

The connection member SM may be disposed between the second pixel PX2 and the fourth pixel PX4 adjacent in the second direction DR2. The minimum distance G24 between the second pixel PX2 and the fourth pixel PX4 adjacent in the second direction DR2 may be the sum of the minimum distance GVS2 between the second pixel PX2 and the connection member SM in the second direction DR2, the minimum distance GVS4 between the fourth pixel PX4 and the connection member SM in the second direction DR2, and the width GSM2 of the connection member SM in the second direction DR2.

A minimum distance G24 between the second pixel PX2 and the fourth pixel PX4 adjacent in the second direction DR2, a second vertical separation distance GV2, and a fourth vertical separation distance GV4 may be substantially the same. To this end, a minimum distance GVS2 between the second pixel PX2 and the connection member SM in the second direction DR2 may be smaller than the second vertical separation distance GV2, and a minimum distance GVS4 between the fourth pixel PX4 and the connection member SM in the second direction DR2 may be smaller than the fourth vertical separation distance GV4. Further, in the first direction DR2, the width GSM2 of the connection member SM may be smaller than the second vertical separation distance GV2 or the fourth vertical separation distance GV4.

As shown in FIG. 22, the minimum distance between pixels of adjacent display devices may be substantially equal to the minimum distance between each of the pixels to prevent the connection member SM from being recognized between images displayed by the plurality of display devices 11, 12, 13, and 14.

Figure 23:
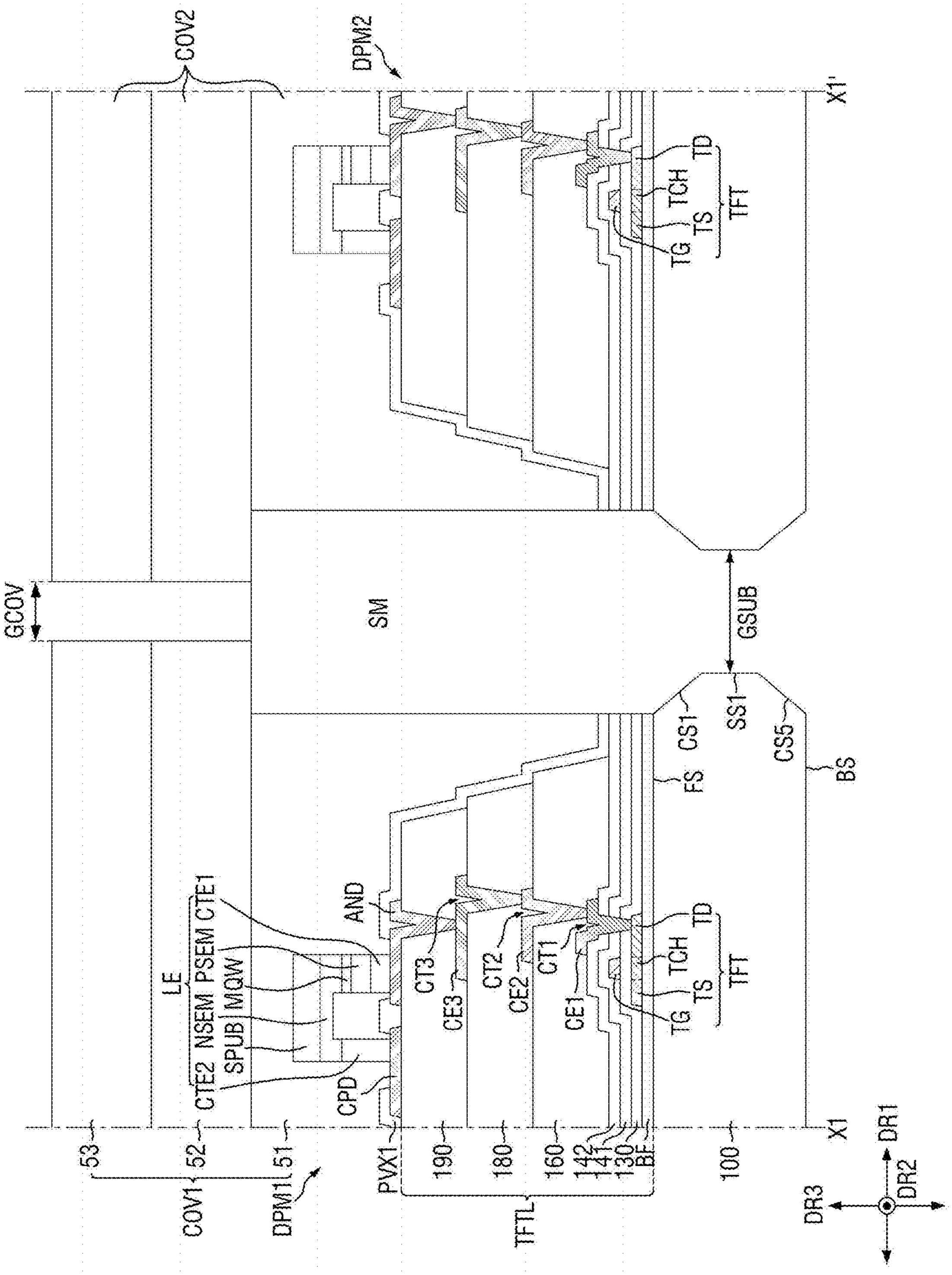
FIG. 23 is a cross-sectional view illustrating an example of a tiled display device taken along the line X1-X1' of FIG. 22.

FIG. 23 is a cross-sectional view illustrating an example of a tiled display device taken along the line X1-X1' of FIG. 22.

Referring to FIG. 23, the first display device 11 includes a first display module DPM1 and a first front cover COV1. The second display device 12 includes a second display module DPM2 and a second front cover COV2.

Each of the first display module DPM1 and the second display module DPM2 includes the substrate 100, the thin film transistor layer TFTL, and the light emitting device layer EML (e.g., light emitting device LE). The thin film transistor layer TFTL and the light emitting device layer have already been described in FIG. 11 in detail. In FIG. 23, the description duplicated with the previous embodiment will be omitted.

The first front cover COV1 may protrude more than the substrate 100 in the first direction DR1 and the second direction DR2. Therefore, a distance GSUB between the substrate 100 of the first display module DPM1 and the substrate 100 of the second display module DPM2 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to attach the light emitting device layer of the first display module DPM1 to the first front cover COV1. The adhesive member 51 of the second front cover COV2 serves to attach a light emitting device layer of the second display module DPM2 to the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent deterioration of image visibility by reflecting external light as it is. Accordingly, the contrast ratio of images displayed by the first display device 11 and the second display device 12 may be increased due to the anti-glare layer 53.

The light transmittance control layer 52 may be designed to reduce transmittance of external light or light reflected from the first display module DPM1 and the second display module DPM2. Accordingly, a gap GSUB between the substrate 100 of the first display module DPM1 and the substrate 100 of the second display module DPM2 may be prevented from being visually recognized from the outside.

The anti-glare layer 53 may be implemented as a polarizing plate, and a light transmittance adjusting layer 52 may be implemented as a phase delay layer, but embodiments of the present specification are not limited thereto.

Because an example of a tiled display device cut along X2-X2', X3-X3', and X4-X4' of FIG. 22 is substantially the same as an example of a tiled display device cut along X1-X1' described in connection with FIG. 23, a description thereof will be omitted.

Figure 24:
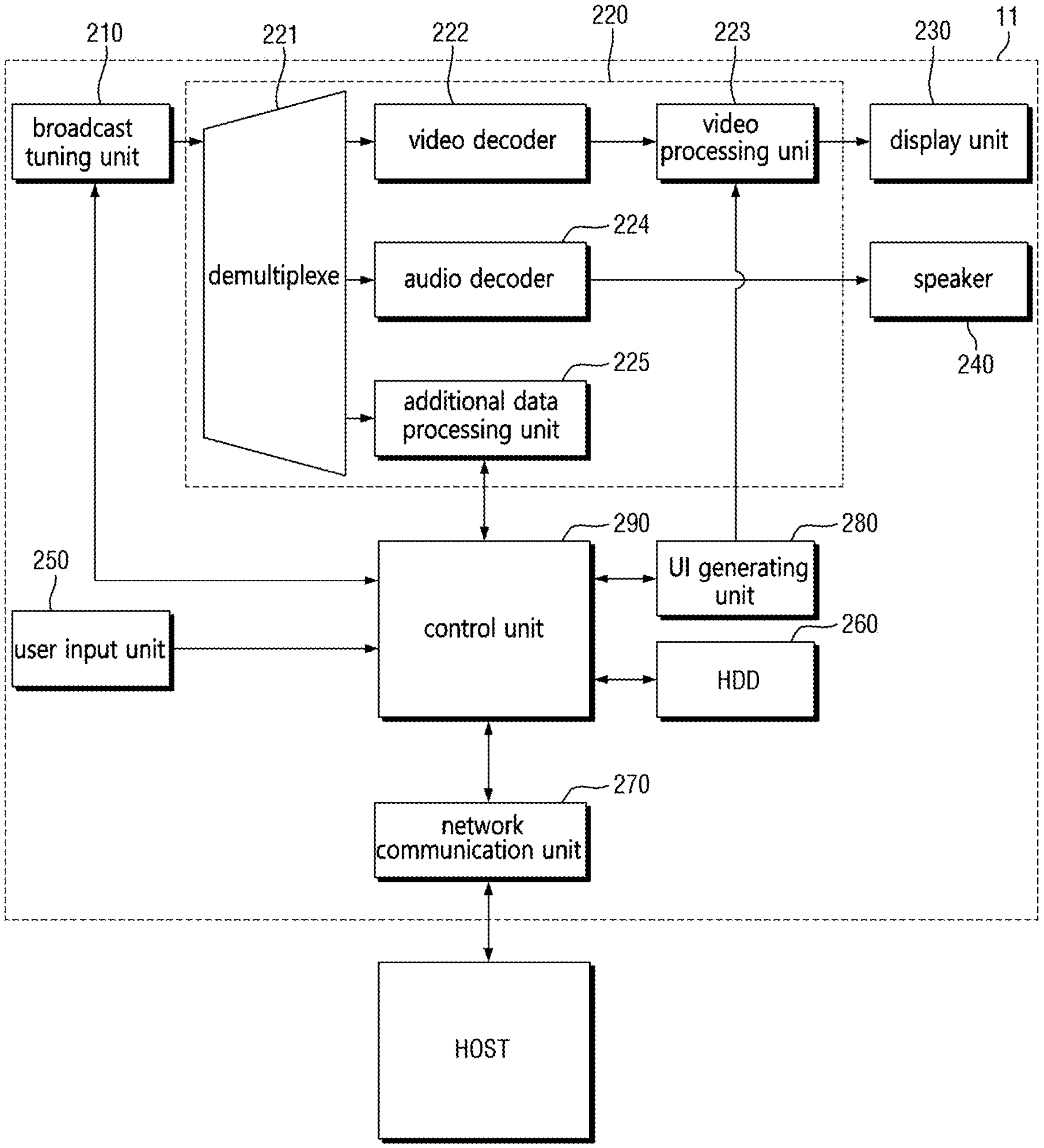
FIG. 24 is a block diagram illustrating a tiled display device according to one or more embodiments.

FIG. 24 is a block diagram illustrating a tiled display device according to one or more embodiments.

In FIG. 24, the first display device 11 and a host system HOST are illustrated for convenience of description.

Referring to FIG. 24, the tiled display device TD according to one or more embodiments may include the host system HOST, a broadcast tuning unit 210, a signal processing unit 220, a display unit 230, a speaker 240, and a user input unit 250, a hard disk drive (HDD) 260, a network communication unit 270, a UI generating unit 280, and a control unit 290.

The host system HOST may be implemented as any one of a television system, a home theater system, a set-top box, a navigation system, a DVD player, a Blu-ray player, a personal computer PC, a mobile phone system, and a tablet.

A user's command may be input to the host system HOST in various formats. For example, the host system HOST may receive a command by a user's touch input. Alternatively, the user's command may be input to the host system HOST by a keyboard input or a button input of a remote controller.

The host system HOST may receive an original video data corresponding to the original image from the outside. The host system HOST may divide the original video data by the number of display devices. For example, the host system HOST corresponds to the first display device 11, the second display device 12, the third display device 13, and the fourth display device 14 (e.g., see FIG. 21), so that the original video data may be divided into the first video data corresponding to a first image, the second video data corresponding to a second image, the third video data corresponding to a third image, and the fourth video data corresponding to a fourth image. The host system HOST may transmit the first video data to the first display device 11, the second video data to the second display device 12, the third video data to the third display device 13, and the fourth video data to the fourth display device 14.

The first display device 11 may display the first image according to the first video data, and the second display device 12 may display the second image according to the second video data. Also, the third display device 13 may display the third image according to the third video data, and the fourth display device 14 may display the fourth image according to the fourth video data. Accordingly, a user may view the original image in which the first to the fourth images displayed on the first to fourth display devices 11, 12, 13, and 14 are combined.

The first display device 11 may include a broadcast tuning unit 210, a signal processing unit 220, a display unit 230, a speaker 240, a user input unit 250, an HDD 260, a network communication unit 270, a UI generator 280, and a controller 290.

The broadcast tuning unit 210 may receive a broadcast signal of the corresponding channel through an antenna by tuning a suitable channel frequency (e.g., a predetermined channel frequency) under the control of the controller 290. The broadcast tuning unit 210 may include a channel detection module and an RF demodulation module.

The broadcast signal demodulated by the broadcast tuning unit 210 is processed by the signal processing unit 220 and output to the display unit 230 and the speaker 240. Here, the signal processing unit 220 may include a demultiplexer 221, a video decoder 222, a video processing unit 223, an audio decoder 224, and an additional data processing unit 225.

The demultiplexer 221 separates the demodulated broadcast signal into a video signal, an audio signal, and additional data. The separated video signal, audio signal, and additional data are restored by the video decoder 222, the audio decoder 224, and the additional data processing unit 225, respectively. In this case, the video decoder 222, the audio decoder 224, and the additional data processing unit 225 restore a decoding format corresponding to the encoding format when the broadcast signal is transmitted.

On the other hand, the decoded video signal is converted by the video processing unit 223 into vertical frequency, resolution, aspect ratio, etc. that meet the output standard of the display unit 230, and the decoded audio signal is output to the speaker 240.

The display unit 230 includes a display panel on which an image is displayed and a panel driver controlling driving of the display panel.

The user input unit 250 may receive a signal transmitted by the host system HOST. The user input unit 250 allows the user to select not only data related to channel selection and User Interface (UI) menu selection and manipulation of a channel transmitted by the host system HOST, but also commands related to communication with other display devices. Also, the user input unit 250 allows data for input to be entered.

The HDD 260 (e.g., a solid state drive (SSD)) stores various software programs including OS programs, recorded broadcast programs, moving pictures, photos, and other data. The HDD 260 may be made of a storage medium such as a hard disk or non-volatile memory.

The network communication unit 270 is for short-distance communication with the host system HOST and other display devices. The network communication unit 270 may be implemented a communication module including an antenna pattern that may implement mobile communication, data communication, Bluetooth, RF, Ethernet, etc.

The network communication unit 270 may transmit and receive a radio signal with at least one of a base station, an external terminal, and a server on a mobile communication network constructed according to technical standards or communication methods (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.) for mobile communication through an antenna pattern to be described later.

The network communication unit 270 may transmit and receive a wireless signal in a communication network according to wireless Internet technologies through an antenna pattern to be described later. As wireless Internet technology, for example, WLAN (Wireless LAN), Wi-Fi (Wireless-Fidelity), Wi-Fi (Wireless Fidelity) Direct, DLNA (Digital Living Network Alliance), WiBro (Wireless Broadband), WiMAX (World Interoperability for Microwave Access), High Speed Downlink Packet Access (HSDPA), High Speed Uplink Packet Access (HSUPA), Long Term Evolution (LTE), Long Term Evolution-Advanced (LTE-A), etc., and the antenna pattern transmits and receives data according to at least one wireless Internet technology within a range including Internet technologies not listed above.

The UI generator 280 generates a UI menu for communication with the host system (HOST) and other display devices, and may be implemented by an algorithm code and an OSD IC. The UI menu for communication with the host system HOST and other display devices may be a menu for designating a counterpart digital TV for communication and selecting a desired function.

The control unit 290 is responsible for overall control of the first display device 11 and responsible for communication control of the host system HOST and the second through fourth display devices 12 through 14 (e.g., see FIG. 21). In the control unit 290, a corresponding algorithm code stores for control and the corresponding algorithm code may be implemented by a Micro Controller Unit (MCU).

According to the input and selection of the user input unit 250, the control unit 290 controls to transmit the corresponding control command and data to the host system HOST and the second to fourth display devices 12, 13, and 14 (e.g., see FIG. 21) through the network communication unit 270. When a suitable control command (e.g., a predetermined control command) and data are received from the host system HOST and the second to fourth display devices 12, 13, and 14 (e.g., see FIG. 21), the control unit 290 performs an operation according to the control command.

Because the block diagram of the second display device 12, the block diagram of the third display device 13, and the block diagram of the fourth display device 14 are substantially the same as the block diagram of the first display device 11, descriptions thereof are omitted.

It should be understood, however, that the aspects and features of embodiments of the present disclosure are not restricted to the one set forth herein. The above and other aspects of the present disclosure will become more apparent to one of ordinary skill in the art to which the present disclosure pertains by referencing the claims, with functional equivalents thereof to be included therein.

What is claimed is:

1. A display device comprising:

a substrate having:

a first side surface;

a first surface;

a second surface opposite to the first surface;

a first chamfered surface extending from an edge of the first surface to the first side surface, and a second chamfered surface extending from an edge of the second surface to the first side surface, the first side surface connecting the first surface, the first chamfered surface, the second chamfered surface, and the second surface;

a pixel on the first surface of the substrate and comprising a light emitting element configured to emit light;

a first driving pad at the edge of the first surface of the substrate and electrically connected to the pixel; and a side wiring on the first surface, the first chamfered surface, the first side surface, the second chamfered surface, and the second surface of the substrate, wherein the first driving pad has:

a flat portion connected to the side wiring; and a partition wall portion having a thickness greater than a thickness of the flat portion of the first driving pad.

2. The display device of claim 1, wherein a top surface of the flat portion of the first driving pad is lower than a top surface of the partition wall portion of the first driving pad.

3. The display device of claim 2, further comprising a bottom wiring configured to supply a power voltage or a signal to the pixel on the first surface of the substrate, wherein the first driving pad comprises a plurality of sub pads, at least one of the sub pads from among the sub pads of the first driving pad has a first contact portion connected to the bottom wiring in the partition wall portion of the first driving pad.

4. The display device of claim 1, wherein the side wiring overlaps the flat portion of the first driving pad in a thickness direction of the substrate and does not overlap the partition wall portion of the first driving pad in the thickness direction of the substrate.

5. The display device of claim 1, wherein the partition wall portion of the first driving pad has:

a first portion extending in a first direction;

a second portion extending in a second direction crossing the first direction and extending from an end of the first portion; and a third portion extending in the second direction and extending from another end of the first portion, wherein the first portion, the second portion, and the third portion are around three side surfaces of the flat portion of the first driving pad.

6. The display device of claim 5, wherein the first portion of the partition wall portion of the first driving pad is between the pixel and the flat portion of the first driving pad.

7. The display device of claim 1, further comprising pad electrodes on the first surface of the substrate and connected to the light emitting element, wherein the flat portion of the first driving pad is at a same layer and comprises a same material as that of the pad electrodes.

8. A display device comprising:

a substrate having:

a first side surface;

a first surface;

a second surface opposite to the first surface;

a first chamfered surface extending from an edge of the first surface; and a second chamfered surface extending from an edge of the second surface, the first side surface connecting the first surface, the first chamfered surface, the second chamfered surface, and the second surface;

a thin film transistor layer comprising:

a plurality of thin film transistors on the first surface of the substrate;

a plurality of data metal layers; and a plurality of planarization layers on the plurality of thin film transistors;

a first driving pad spaced from the plurality of planarization layers on the first surface of the substrate; and a side wiring on the first surface, the first chamfered surface, the first side surface, the second chamfered surface, and the second surface of the substrate, wherein the first driving pad has:

a flat portion in contact with the side wiring and having one surface parallel to the first surface of the substrate; and a partition wall portion at where the plurality of data metal layers are stacked.

9. The display device of claim 8, wherein the plurality of data metal layers further comprises:

a lower data metal layer comprising a first sub pad and a first connection electrode connected to a thin film transistor from among the plurality of thin film transistors;

an upper data metal layer on the lower data metal layer and comprising a second sub pad and an anode pad electrode connected to the first connection electrode; and a first protective layer exposing a part of upper surfaces of the second sub pad and the anode pad electrode, wherein the second sub pad overlaps the first sub pad in the partition wall portion of the first driving pad and does not overlap the first sub pad in the flat portion of the first driving pad.

10. The display device of claim 9, wherein the second sub pad is in contact with a part of an upper surface and a side surface of the first sub pad.

11. The display device of claim 8, wherein the partition wall portion of the first driving pad is between the flat portion of the first driving pad and the plurality of planarization layers.

12. The display device of claim 8, wherein a top surface of the partition wall portion of the first driving pad is higher than a top surface of the flat portion of the first driving pad.

13. The display device of claim 8, further comprising a bottom wiring between the first surface of the substrate and the first driving pad, wherein the partition wall portion of the first driving pad has a first contact portion exposing a top surface of the bottom wiring.

14. A display device comprising:

a substrate having:

a first side surface;

a first surface;

a second surface opposite to the first surface;

a first chamfered surface extending from an edge of the first surface to the first side surface; and a second chamfered surface extending from an edge of the second surface to the first side surface;

a pixel on the first surface of the substrate and comprising a light emitting element configured to emit light;

a first driving pad at the edge of the first surface of the substrate and electrically connected to the pixel;

an inspection pad connected to the first driving pad on the first surface of the substrate; and a side wiring connected to the first driving pad and being on the first surface of the substrate, the first chamfered surface, the first side surface, the second chamfered surface, and the second surface, wherein the inspection pad has a flat portion and a partition wall portion having an upper surface higher than an upper surface of the flat portion.

15. The display device of claim 14, further comprising a first connection line connecting the first driving pad and the inspection pad, wherein the first connection line is at a same layer as a gate electrode of a thin film transistor.

16. The display device of claim 14, wherein the inspection pad has an L-shape in a cross-sectional view, wherein the flat portion of the inspection pad forms a bottom surface of the inspection pad, and the partition wall portion of the inspection pad forms a partition wall of the inspection pad.

17. The display device of claim 14, wherein a top surface of the partition wall portion of the inspection pad is 1 μm to 3 μm higher than a top surface of the flat portion of the inspection pad.

18. The display device of claim 14, further comprising:

a plurality of thin film transistors on the first surface of the substrate;

a lower data metal layer on the thin film transistors;

an upper data metal layer on the lower data metal layer; and a first passivation layer exposing a part of an upper surface of the upper data metal layer;

wherein the upper data metal layer overlaps the lower data metal layer at the partition wall portion of the inspection pad and does not overlap the lower data metal layer at the flat portion of the inspection pad.

19. A tiled display device comprising:

a plurality of display devices; and a connection member between the display devices, wherein a first display device from among the display devices comprises:

a substrate having a first side surface, a first surface, a second surface opposite to the first surface, a first chamfered surface extending from an edge of the first surface to the first side surface, and a second chamfered surface extending from an edge of the second surface to the first side surface;

a pixel on the first surface of the substrate and comprising a light emitting element configured to emit light;

a first driving pad at the edge of the first surface of the substrate and electrically connected to the pixel;

an inspection pad connected to the first driving pad on the first surface of the substrate; and a side wiring connected to the first driving pad and being on the first surface of the substrate, the first chamfered surface, the first side surface, the second chamfered surface, and the second surface, wherein the inspection pad has a flat portion and a partition wall portion having an upper surface higher than an upper surface of the flat portion.

20. The tiled display device of claim 19, wherein the light emitting element is a flip-chip type micro light emitting diode element.

21. The tiled display device of claim 19, wherein the substrate comprises glass.

22. The tiled display device of claim 19, wherein the first display device further comprises:

a connection line on the second surface of the substrate; and a flexible film connected to the connection line through a conductive adhesive member, wherein the side wiring is connected to the connection line.

23. The tiled display device of claim 19, wherein the display devices are arranged in a matrix form in M rows and N columns, and wherein M and N are positive integers.

* * * * *